(12) United States Patent
Choi et al.

(10) Patent No.: US 9,612,773 B2
(45) Date of Patent: Apr. 4, 2017

(54) USER DEVICE HAVING A HOST FLASH TRANSLATION LAYER (FTL), A METHOD FOR TRANSFERRING AN ERASE COUNT THEREOF, A METHOD FOR TRANSFERRING REPROGRAM INFORMATION THEREOF, AND A METHOD FOR TRANSFERRING A PAGE OFFSET OF AN OPEN BLOCK THEREOF

(71) Applicant: SAMSUNG ELECTRONICS CO., LTD., Suwon-si, Gyeonggi-do (KR)

(72) Inventors: Wan-Soo Choi, Suwon-si (KR); Jun-Ho Jang, Yongin-si (KR); Yonghwan Song, Suwon-si (KR); Min-Woo Kim, Yongin-si (KR); Woonjae Chung, Gunpo-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 68 days.

(21) Appl. No.: 14/540,122

(22) Filed: Nov. 13, 2014

(65) Prior Publication Data
US 2015/0143035 A1    May 21, 2015

Related U.S. Application Data

(60) Provisional application No. 61/906,980, filed on Nov. 21, 2013.

(30) Foreign Application Priority Data

| Mar. 5, 2014 | (KR) | 10-2014-0026173 |
| Mar. 5, 2014 | (KR) | 10-2014-0026174 |
| Mar. 5, 2014 | (KR) | 10-2014-0026175 |

(51) Int. Cl.
*G06F 12/00* (2006.01)
*G06F 13/00* (2006.01)
(Continued)

(52) U.S. Cl.
CPC .......... *G06F 3/0661* (2013.01); *G06F 3/0619* (2013.01); *G06F 3/0679* (2013.01); *G11C 16/102* (2013.01)

(58) Field of Classification Search
CPC ........... G06F 2206/1014; G06F 3/0619; G06F 3/0661; G06F 3/0679
(Continued)

(56) References Cited

U.S. PATENT DOCUMENTS 5,406,529 A * 4/1995 Asano ................... G06F 3/0601
365/185.11
6,000,006 A * 12/1999 Bruce ................ G06F 11/1068
711/103
(Continued)

FOREIGN PATENT DOCUMENTS

| JP | 07-014392 | 1/1995 |
| JP | 2000-207889 | 7/2000 |

(Continued)

Primary Examiner — Sheng-Jen Tsai
(74) Attorney, Agent, or Firm — F. Chau & Associates, LLC

(57) ABSTRACT

A user device includes a storage device including a flash memory; and a host connected to the storage device via an interface and adapted to transmit data to the storage device. The host provides the storage device with erase count information of the flash memory using a host flash translation layer (FTL), provides the storage device with reprogram information when the flash memory uses a reprogram method, or provides the storage device with page offset information of an open block of the flash memory.

16 Claims, 27 Drawing Sheets

(51) Int. Cl.
*G06F 13/28* (2006.01)
*G06F 3/06* (2006.01)
*G11C 16/10* (2006.01)

(58) Field of Classification Search
USPC .......................................................... 711/103
See application file for complete search history.

(56) References Cited

U.S. PATENT DOCUMENTS

| | | | | |
|---|---|---|---|---|
| 7,257,026 | B2* | 8/2007 | Yamada | G11C 11/5621 365/185.03 |
| 7,646,636 | B2* | 1/2010 | Kim | G06F 12/0246 365/168 |
| 7,657,702 | B2* | 2/2010 | Conley | G06F 12/0246 711/103 |
| 7,821,837 | B2* | 10/2010 | Chun | G11C 16/12 365/185.22 |
| 8,004,905 | B2* | 8/2011 | Ishii | G11C 16/0491 365/185.02 |
| 8,078,796 | B2* | 12/2011 | Rudelic | G11C 16/32 711/103 |
| 8,156,393 | B2* | 4/2012 | Nagadomi | G06F 11/008 365/185.01 |
| 8,321,647 | B2* | 11/2012 | Khmelnitsky | G06F 12/0246 711/154 |
| 8,370,603 | B2* | 2/2013 | Toelkes | G06F 12/0246 711/103 |
| 8,438,453 | B2* | 5/2013 | Post | G06F 11/1068 714/763 |
| 8,473,668 | B2* | 6/2013 | Kim | G11C 11/5628 365/185.09 |
| 8,576,622 | B2* | 11/2013 | Yoon | G11C 11/5642 365/185.03 |
| 8,694,750 | B2* | 4/2014 | Vyshetsky | G06F 12/0246 711/1 |
| 9,299,455 | B2* | 3/2016 | Suzuki | G11C 29/028 |
| 2007/0121392 | A1* | 5/2007 | Nawaki | G11C 16/12 365/191 |
| 2007/0233931 | A1* | 10/2007 | Tanaka | G06F 12/0246 711/5 |
| 2008/0117685 | A1* | 5/2008 | Syzdek | G11C 16/28 365/185.21 |
| 2008/0201518 | A1* | 8/2008 | Kim | G06F 12/0246 711/103 |
| 2009/0070547 | A1* | 3/2009 | Jeong | G06F 12/0246 711/209 |
| 2009/0073762 | A1* | 3/2009 | Lee | G06F 11/1072 365/185.03 |
| 2009/0198869 | A1* | 8/2009 | Mosek | G06F 12/0246 711/103 |
| 2010/0023682 | A1* | 1/2010 | Lee | G06F 12/0246 711/103 |
| 2010/0169544 | A1* | 7/2010 | Eom | G06F 12/0246 711/103 |
| 2010/0228906 | A1* | 9/2010 | Ramiya Mothilal | G06F 12/0246 711/103 |
| 2010/0332732 | A1* | 12/2010 | Chiang | G06F 12/0246 711/103 |
| 2011/0055460 | A1* | 3/2011 | Chen | G06F 12/0246 711/103 |
| 2011/0170346 | A1* | 7/2011 | Nagai | G11C 11/5628 365/185.2 |
| 2012/0198128 | A1* | 8/2012 | Van Aken | G06F 12/0246 711/103 |
| 2012/0203958 | A1* | 8/2012 | Jones | G06F 12/0246 711/103 |
| 2012/0239889 | A1* | 9/2012 | Lee | G06F 12/0246 711/154 |
| 2012/0268994 | A1* | 10/2012 | Nagashima | G06F 11/1048 365/185.11 |
| 2013/0111298 | A1* | 5/2013 | Seroff | G06F 3/0614 714/758 |
| 2013/0145164 | A1* | 6/2013 | Nagai | H04L 9/0816 713/171 |
| 2013/0151754 | A1* | 6/2013 | Post | G06F 12/0246 711/103 |
| 2013/0238836 | A1* | 9/2013 | Suzuki | G11C 16/3431 711/103 |
| 2013/0297894 | A1* | 11/2013 | Cohen | G06F 3/0679 711/154 |
| 2013/0318281 | A1* | 11/2013 | Fujimoto | G11C 5/00 711/102 |
| 2014/0059279 | A1* | 2/2014 | He | G06F 12/0246 711/103 |
| 2014/0136753 | A1* | 5/2014 | Tomlin | G06F 12/0246 711/103 |
| 2014/0208004 | A1* | 7/2014 | Cohen | G06F 12/0246 711/103 |
| 2014/0258588 | A1* | 9/2014 | Tomlin | G06F 12/0246 711/103 |
| 2015/0058697 | A1* | 2/2015 | Iwasaki | G06F 11/1048 714/773 |
| 2015/0212935 | A1* | 7/2015 | Roeder | G06F 12/0246 711/103 |
| 2015/0228346 | A1* | 8/2015 | Choi | G11C 16/10 365/185.22 |

FOREIGN PATENT DOCUMENTS

| | | |
|---|---|---|
| JP | 2005-135544 | 5/2005 |
| JP | 2007-080395 | 3/2007 |
| JP | 2008-146521 | 6/2008 |
| JP | 2010-176399 | 8/2010 |
| JP | 2010-250534 | 11/2010 |
| JP | 2011-022760 | 2/2011 |
| JP | 2012-018714 | 1/2012 |
| JP | 2013-196161 | 9/2013 |
| KR | 1020100013485 | 2/2010 |
| KR | 1020100113994 | 10/2010 |
| KR | 1020130079057 | 7/2013 |

* cited by examiner

FIG. 16

| | LSB | CSB | MSB |
|---|---|---|---|
| WL63 | 189 | 190 | 191 |
| WL62 | 186 | 187 | 188 |
| ⋮ | ⋮ | ⋮ | ⋮ |
| WL2 | 6 | 7 | 8 |
| WL1 | 3 | 4 | 5 |
| WL0 | 0 | 1 | 2 |

<Page Address>

| | LSB | CSB | MSB |
|---|---|---|---|
| WL63 | 71 | 131 | 191 |
| WL62 | 70 | 130 | 190 |
| ⋮ | ⋮ | ⋮ | ⋮ |
| WL2 | | 7 | 10 |
| WL1 | 1 | | 8 |
| WL0 | 0 | 2 | |

<Program Order>

USER DEVICE HAVING A HOST FLASH TRANSLATION LAYER (FTL), A METHOD FOR TRANSFERRING AN ERASE COUNT THEREOF, A METHOD FOR TRANSFERRING REPROGRAM INFORMATION THEREOF, AND A METHOD FOR TRANSFERRING A PAGE OFFSET OF AN OPEN BLOCK THEREOF

CROSS-REFERENCE TO RELATED APPLICATIONS

This application claims priority under 35 U.S.C. §119 to U.S. Provisional Patent Application No. 61/906,980 filed Nov. 21, 2013, in United States Patent and Trademark Office, and Korean Patent Application Nos. 10-2014-0026173, 10-2014-0026174, and 10-2014-0026175 filed Mar. 5, 2014, in the Korean Intellectual Property Office, the disclosures of which are incorporated by reference herein in their entireties.

TECHNICAL FIELD

The inventive concept described herein relates to a user device, and more particularly, to an erase count transferring method, a reprogram information transferring method, and a method of transferring a page offset of an open block, in a user device having a host flash translation layer.

DISCUSSION OF RELATED ART

A storage system may consist of a host and a storage device. The host and the storage device may be connected through various standardized interfaces such as a serial advanced technology attachment (SATA), universal flash storage (UFS), a small computer system interface (SCSI), a serial attached SCSI (SAS), an embedded multi-media card (eMMC), and so on.

The storage device may include nonvolatile memories such as flash memory, magnetoresistive random access memory (MRAM), phase-change RAM (PRAM), ferroelectric RAM (FeRAM), and so on. A flash memory-based storage device may use a flash translation layer (FTL).

As a characteristic is lowered due to shrinkage of the storage device, a variety of schemes have been developed to ensure the reliability of the storage device. In particular, a user device in which a host manages the FTL has been used to provide the storage device with information necessary to improve its performance and ensure its reliability.

SUMMARY

An exemplary embodiment of the inventive concept provides a user device which comprises a storage device including a flash memory; and a host connected to the storage device via an interface and adapted to transmit data to the storage device. The host provides the storage device with erase count information of the flash memory using a host flash translation layer (FTL), provides the storage device with reprogram information when the flash memory uses a reprogram method, or provides the storage device with page offset information of an open block of the flash memory.

In an exemplary embodiment of the inventive concept, the flash memory includes a plurality of memory blocks, and the erase count information is a max erase count of erase counts of the memory blocks. The host provides the storage device with the erase count information of the flash memory periodically. The host provides the storage device with the erase count information of the flash memory when the storage device is booted up.

In an exemplary embodiment of the inventive concept, the storage device adjusts a read level of the flash memory using the erase count information. The flash memory includes a plurality of block types, and wherein the erase count information is a max erase count of each block type.

In an exemplary embodiment of the inventive concept, the host provides the storage device with the reprogram information using a program command field format. The program command field format includes a storage address format. The reprogram information is included in the storage address format.

In an exemplary embodiment of the inventive concept, the host provides the storage device with the page offset information of the open block when a specific condition is satisfied.

In an exemplary embodiment of the inventive concept, the specific condition includes a condition in which a read-target block is an open block and a read operation is first performed after the user device is initialized, a condition in which a read-target block is an open block and a memory block is changed in the same concurrently addressable unit (CAU), or a condition in which a read-target block is an open block and a page offset of the read-target block is changed.

In an exemplary embodiment of the inventive concept, a memory cell array of the flash memory has a three-dimensional structure in which cell strings are formed in a direction perpendicular to a substrate.

An exemplary embodiment of the inventive concept provides an erase count transferring method of a user device which includes a storage device including a flash memory; and a host connected to the storage device via an interface and adapted to drive a host FTL, the erase count transferring method comprising transferring, from the host, a setting command mark to setup the storage device for a transfer of an erase count; sending, from the host, a setting erase count corresponding to a storage address format; transmitting, from the storage device, erase count data including an erase count of the flash memory; and sending, from the host, a setting command end mark for ending a command setting.

In an exemplary embodiment of the inventive concept, the erase count is a max erase count of erase counts of memory blocks in the flash memory. The host provides the erase count of the flash memory periodically or when the storage device is booted up. The storage device adjusts a read level of the flash memory using the erase count. The flash memory includes a plurality of block types, and wherein the erase count is a max erase count of each block type.

An exemplary embodiment of the inventive concept provides a reprogram information transferring method of a user device which includes a storage device including a flash memory; and a host connected to the storage device via an interface and adapted to drive a host FTL. The reprogram information transferring method including transferring, from the host, a program mark for indicating a transfer of information for a write operation; sending, from the host, a storage address format for designating a storage location of program data in the flash memory; and transmitting, from the host, a program end mark for reporting a program end. The host provides reprogram information to the storage device when the flash memory uses a reprogram method.

In an exemplary embodiment of the inventive concept, the host provides the storage device with the reprogram information using a program hint command field format. The program hint command field format includes a storage address format. The reprogram information is included in the storage address format.

The program hint command field format is provided to the storage device prior to a transfer of a program command. The program hint command field format is formed of a program hint mark, a storage address format, and a program hint end mark. The program hint command field format does not include program data.

An exemplary embodiment of the inventive concept provides a method of transferring a page offset of an open block in a user device which includes a storage device including a flash memory; and a host connected to the storage device via an interface. The method includes providing, from the host, page offset information of an open block when a specific condition is satisfied; and providing, from the host, a read command to the storage device after the page offset information of the open block is provided.

In an exemplary embodiment of the inventive concept, the specific condition includes a condition in which a read-target block is an open block and a read operation is first performed after the user device is initialized, a condition in which a read-target block is an open block and a memory block is changed in the same CAU, or a condition in which a read-target block is an open block and a page offset of the read-target block is changed.

In an exemplary embodiment of the inventive concept, a page offset command field format of the open block includes a read command mark, a storage address format, and a read command end mark. The storage address format includes a read hint area and a page offset area, and the page offset command field format and a read command field format are determined by the read hint area. The host includes a buffer random access memory (RAM) for driving a host FTL.

In an exemplary embodiment of the inventive concept, there is provided a device including a host including a translation layer; and a storage device including a nonvolatile memory. The host provides erase count information of a memory block in the nonvolatile memory to the storage device, reprogram information to the storage device, or information about available space in the nonvolatile memory to the storage device.

The reprogram information is included in a storage address format area of a command field.

The information about available space in the nonvolatile memory is included in a storage address format area of a command field.

BRIEF DESCRIPTION OF THE FIGURES

The above and other features of the inventive concept will become more apparent by describing exemplary embodiments thereof with reference to the accompanying figures, in which:

FIGS. 15 and 16 are diagrams for describing a reprogram information transferring method shown in FIG. 14, according to an exemplary embodiment of the inventive concept;

DETAILED DESCRIPTION OF THE EMBODIMENTS

Figure 1:
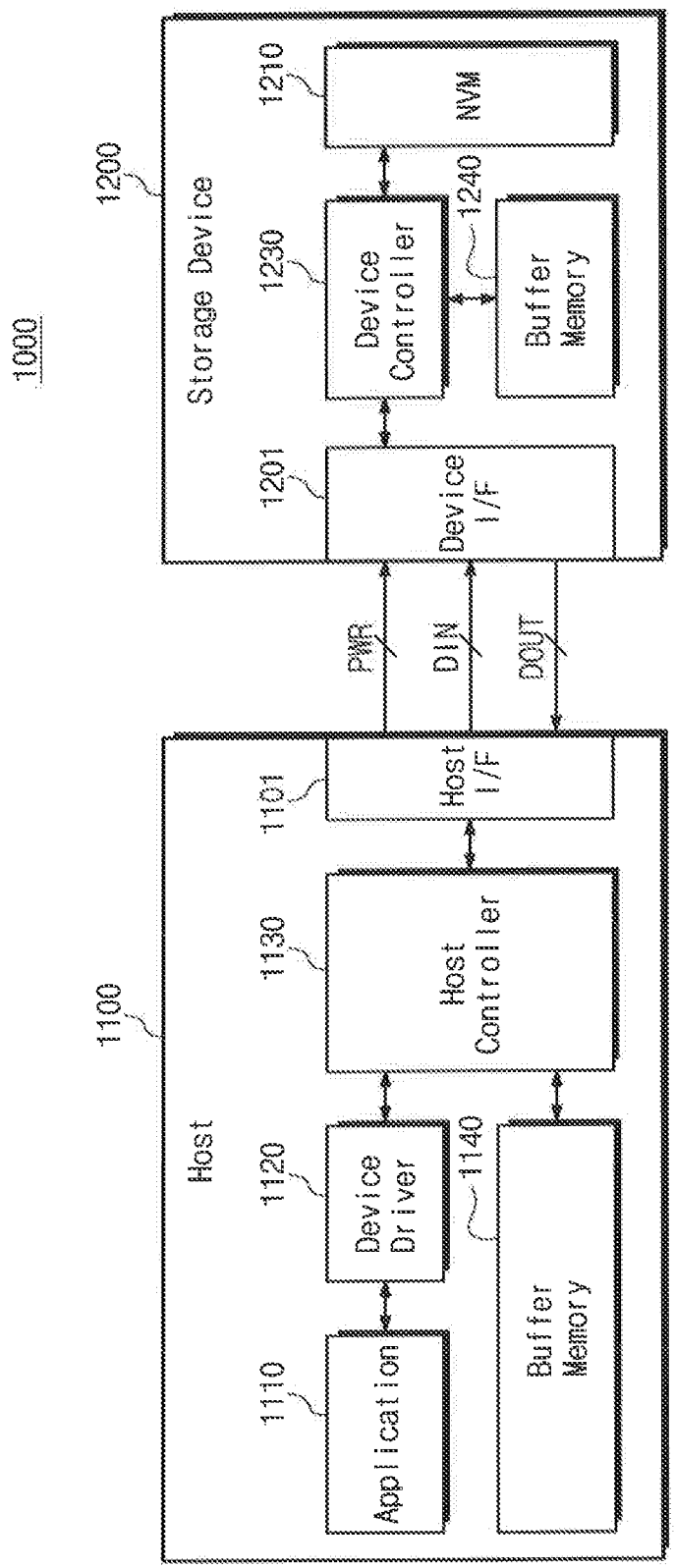
FIG. 1 is a block diagram illustrating a user device according to an exemplary embodiment of the inventive concept.

Exemplary embodiments of the inventive concept will be described in detail with reference to the accompanying drawings. The inventive concept, however, may be embodied in various different forms, and should not be construed as being limited only to the illustrated embodiments. Unless otherwise noted, like reference numerals denote like elements throughout the attached drawings and written description, and thus descriptions will not be repeated. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present. FIG. 1 is a block diagram illustrating a user device according to an exemplary embodiment of the inventive concept. Referring to FIG. 1, a user device 1000 may comprise a host 1100 and a storage device 1200. The host 1100 and the storage device 1200 may be connected through a variety of standardized interfaces such as a serial advanced technology attachment (SATA), universal flash storage (UFS), a small computer system interface (SCSI), a serial attached SCSI (SAS), an embedded multi-media card (eMMC), and so on.

As illustrated in FIG. 1, a host interface 1101 and a device interface 1201 may be connected through data lines DIN and DOUT for exchanging data or signals and a power line PWR for providing a power. The host 1100 may include an application 1110, a device driver 1120, a host controller 1130, and a buffer memory 1140.

The application 1110 may be various application programs to be executed by the host 1100. The device driver 1120 may drive peripheral devices that are used through connection with the host 1100, and it may drive the storage device 1200, for example. The application 1110 or the device driver 1120 may be implemented by software or firmware. The host controller 1130 may exchange data with the storage device 1200 through the host interface 1101.

The buffer memory 1140 may be used as a main memory or a cache memory of the host 1100. In addition, the buffer memory 1140 may be used as a driving memory for driving software, such as the application 1110 or the device driver 1120, or firmware such as a host flash translation layer (FTL).

The storage device 1200 may be connected to the host 1100 through the device interface 1201. The storage device 1200 may include a nonvolatile memory 1210, a device controller 1230, and a buffer memory 1240. The nonvolatile memory 1210 may include, but is not limited to, flash memory, magnetoresistive random access memory (MRAM), phase-change RAM (PRAM), ferroelectric (Fe-RAM), and so on. The device controller 1230 may control an overall operation of the nonvolatile memory 1210 including a write operation, a read operation, an erase operation, and so on. The device controller 1230 may exchange data with the nonvolatile memory 1210 or the buffer memory 1240 through an address or data bus.

The buffer memory 1240 may be used to temporarily store data read from the nonvolatile memory 1210 or data to be written to the nonvolatile memory 1210. The buffer memory 1240 may be implemented with a volatile memory or a nonvolatile memory. The buffer memory 1240 may be used as a main memory or a cache memory of the storage device 1200.

In addition, the buffer memory 1240 may be used as a driving memory for driving software or firmware such as a command manager, a flash manager, an error fix manager, and so on.

Figure 2:
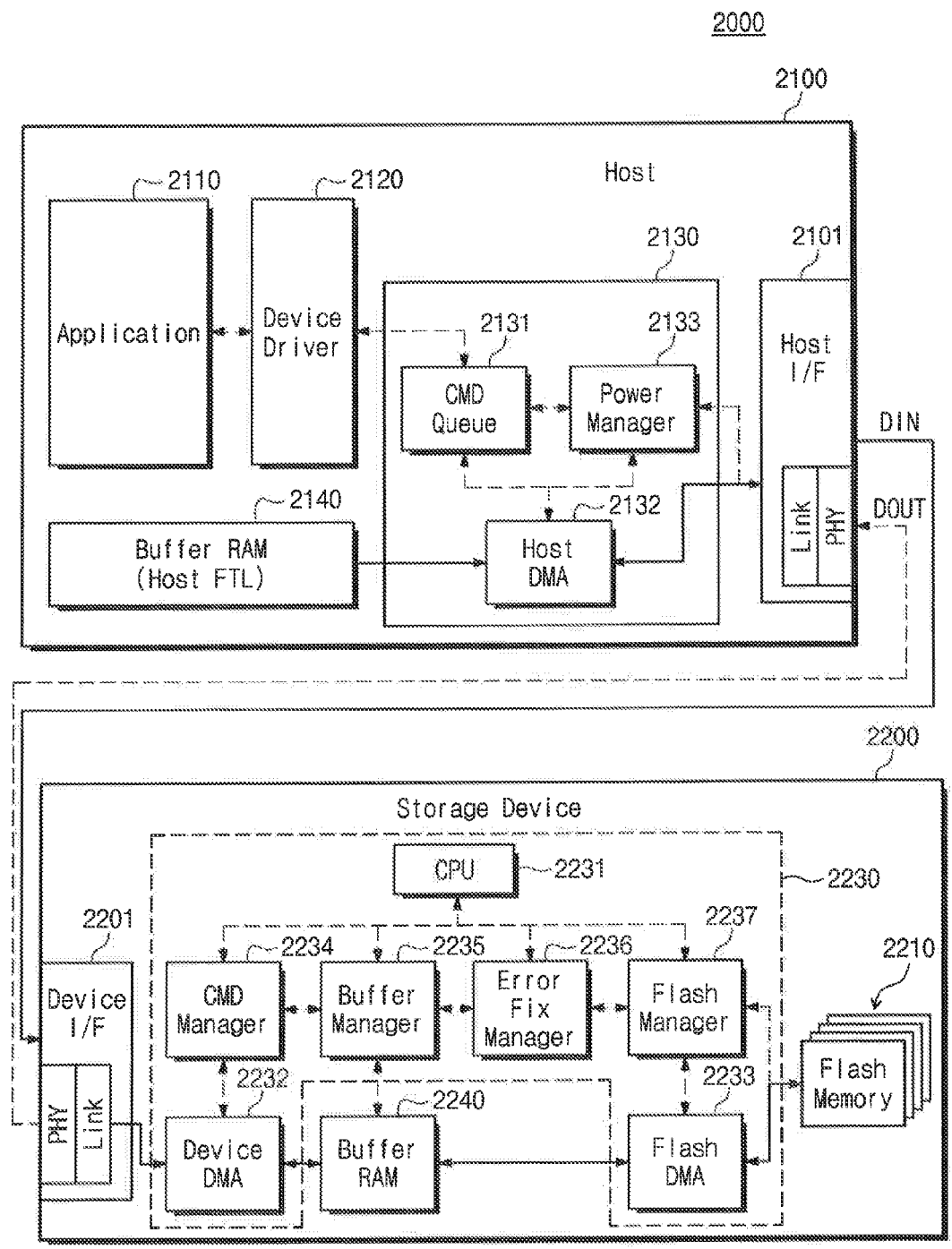
FIG. 2 is a block diagram illustrating a flash memory-based user device according to an exemplary embodiment of the inventive concepts

FIG. 2 is a block diagram illustrating a flash memory-based user device according to an exemplary embodiment of the inventive concept. A user device 2000 shown in FIG. 2 may be a mobile device, such as a smart phone, a tablet personal computer (PC), an e-book, a mobile phone, and so on. Referring to FIG. 2, the user device 2000 includes a host 2100 and a storage device 2200.

The host 2100 may include an application 2110, a device driver 2120, a host controller 2130, and a buffer RAM 2140, The host controller 2130 may include a command queue 2131, a host direct memory access (DMA) 2132, and a power manager 2133.

A command (e.g., a write command) generated by the application 2110 and the device driver 2120 in the host 2100 may be provided to the command queue 2131 of the host controller 2130. The command queue 2131 may sequentially store commands to be provided to the storage device 2200. The commands stored in the command queue 2131 may be provided to the host DMA 2132. The host DMA 2132 may send the commands to the storage device 2200 through a host interface 2101. The host interface 2101 may include a physical layer and a link layer.

The storage device 2200 may include a flash memory 2210, a device controller 2230, and a buffer RAM 2240. The device controller 2230 may include a central processing unit (CPU) 2231, a device DMA 2232, a flash DMA 2233, a command manager 2234, a buffer manager 2235, an error fix manager 2236, and a flash manager 2237.

A command transferred from the host 2100 to the storage device 2200 may be provided to the device DMA 2232 through a device interface 2201. The device interface 2201 may include a physical layer and a link layer. The device DMA 2232 transfers the input command to the command manager 2234. The command manager 2234 is a module that analyzes a command received from the host 2100 and converts the command to be suitable for transmission to the flash memory 2210. In addition, the command manager 2234 allocates the buffer RAM 2240 to receive data through the buffer manager 2235. If there is ready to transfer data, the command manager 2234 may send a transmission ready complete signal READY_TO_TRANSFER to the host 2100.

The host 2100 may send data to the storage device 2200 in response to the transmission ready complete signal READY_TO_TRANSFER. The data may be sent to the storage device 2200 through the host DMA 2132 and the host interface 2101. The storage device 2200 may store the received data in the buffer RAM 2240 through the device DMA 2232 and the buffer manager 2235. The data stored in the buffer RAM 2240 may be provided to the flash manger 2237 through the flash DMA 2233. The flash manager 2237 may store data at an address of the flash memory 2210.

If a data transfer operation and a program operation associated with a command are completed, the storage device 2200 may send a response signal to the host 2100 through an interface and may inform the host 2100 that the operations associated with the command are completed. Based on the response signal, the host 2100 may inform the device driver 2120 and the application 2110 whether the operations associated with the command are completed and terminate any operations remaining for that command.

Figure 3:
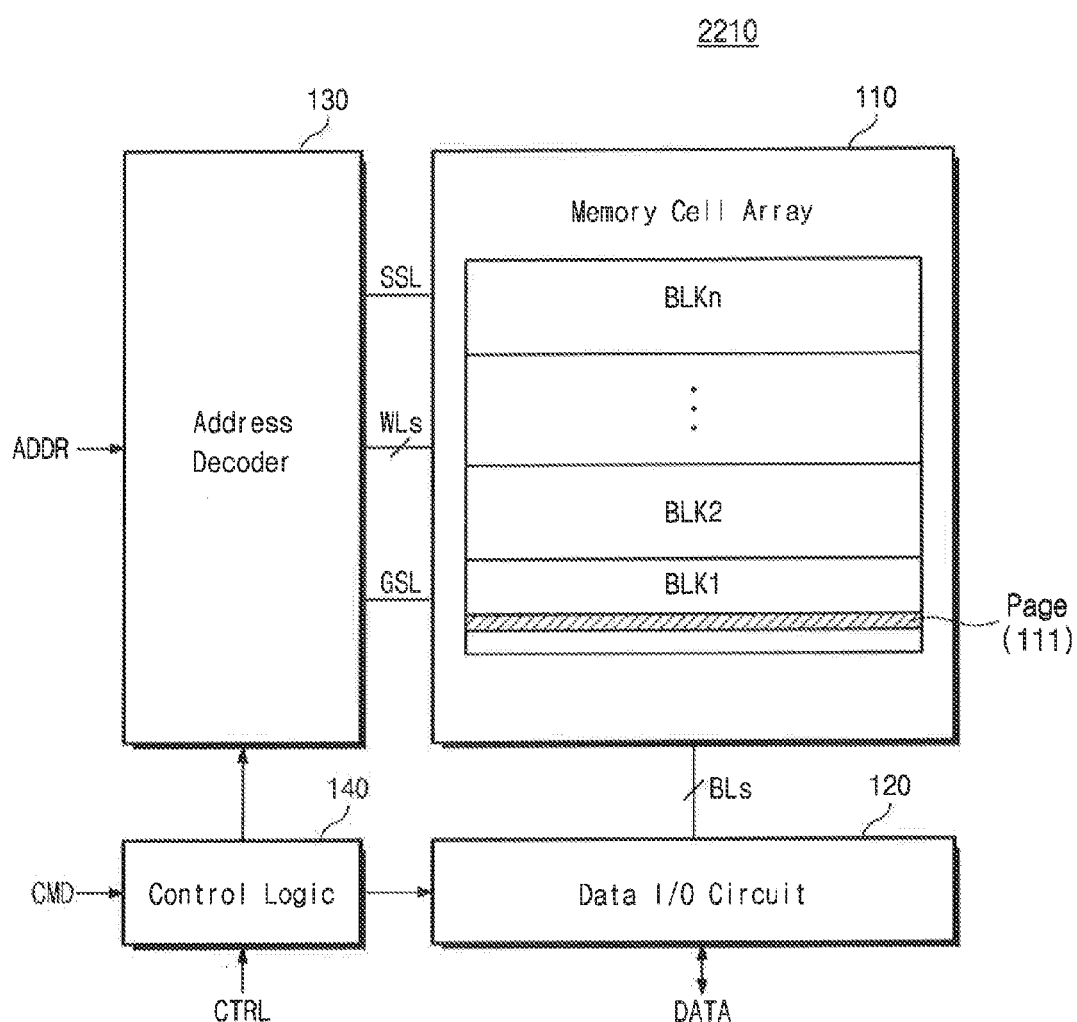
FIG. 3 is a block diagram illustrating a flash memory device shown in FIG. 2, according to an exemplary embodiment of the inventive concept.

FIG. 3 is a block diagram illustrating a flash memory device shown in FIG. 2, according to an exemplary embodiment of the inventive concept. Referring to FIG. 3, a flash memory 2210 includes a memory cell array 110, a data input/output circuit 120, an address decoder 130, and control logic 140.

The memory cell array 110 contains a plurality of memory blocks BLK1 to BLKn, each of which is formed of a plurality of pages. Each page may be formed of a plurality of memory cells. The flash memory 2210 performs an erase operation by the memory block and a write or a read operation by the page.

Each memory cell that stores one data bit may be named a single level cell or a single bit cell. Each memory cell that stores two or more data bits may be named a multi-level cell or a multi-bit cell.

The single level cell may have an erase state or a program state based on its threshold voltage. The multi-level cell may have one of an erase state and a plurality of program states based on its threshold voltage. The flash memory 2210 may include both the single level cells and multi-level cells.

The data input/output circuit 120 is connected with the memory cell array 110 through a plurality of bit lines BLs. The data input/output circuit 120 receives data DATA from an external device and transfers program data to a selected page 111. At a read operation, the data input/output circuit 120 reads data from the selected page 111 to output it to the external device.

The address decoder 130 is connected with the memory cell array 110 through a plurality of word lines WLs, a string selection line SSL and a ground selection line GSL. The address decoder 130 selects a memory block or a page in response to an address ADDR. Here, an address for selecting a memory block may be named a block address, and an address for selecting a page may be named a page address. Below, it is assumed that one page 111 of a first memory block BLK1 is selected.

The control logic 140 may control programming, erasing, and reading of the flash memory 1000. For example, at programming, the control logic 140 may control the address decoder 130 such that a program voltage is supplied to a selected word line and the data input/output circuit 120 such that data is programmed at the selected page 111. The control logic 140 controls programming, erasing, and reading of the flash memory 1000 based on a control signal CTRL from the device controller 2230 (refer to FIG. 2). The control logic 140 may receive a corresponding command CMD from the device controller 2230 (refer to FIG. 2).

Figure 4:
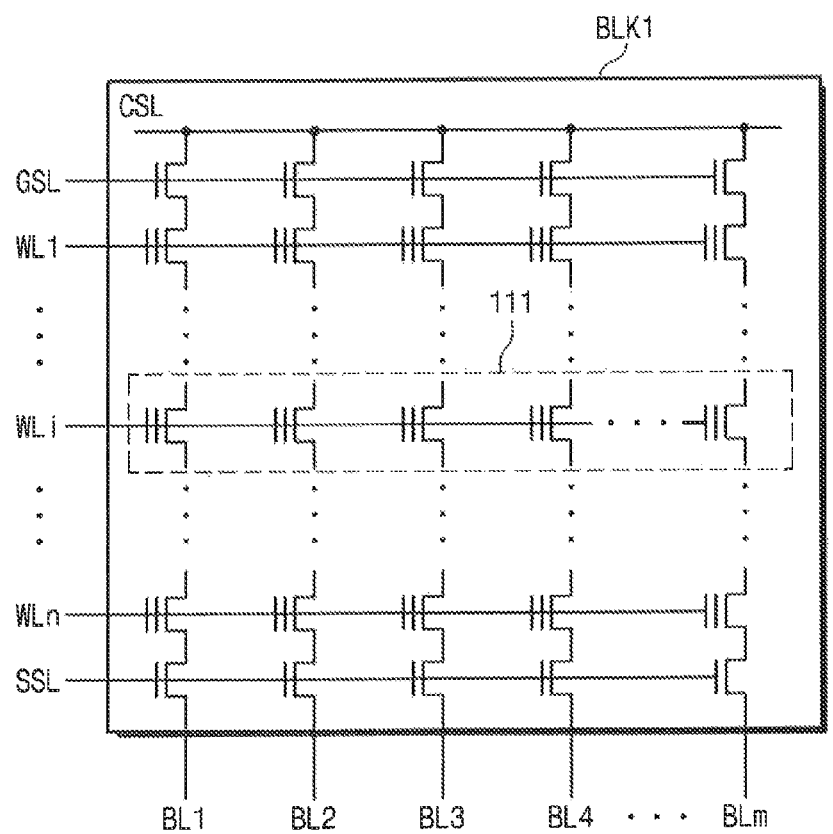
FIG. 4 is a circuit diagram illustrating a memory block shown in FIG. 3, according to an exemplary embodiment of the inventive concept.

FIG. 4 is a circuit diagram illustrating a memory block shown in FIG. 3, according to an exemplary embodiment of the inventive concept. Referring to FIG. 4, a memory block BLK1 may be of a cell string structure. A cell string includes a string selection transistor connected to a string selection line SSL, memory cells connected to word lines WL1 to WLn, and a ground selection transistor connected to a ground selection line GSL. The string selection transistors are connected to bit lines BL1 to BLm, and the ground selection transistors are connected to a common source line CSL.

In FIG. 4, a selected page 111 may experience simultaneous programming. A page may be divided into a main area for storing main data and a spare area for storing additional data such as parity bits.

Figure 5:
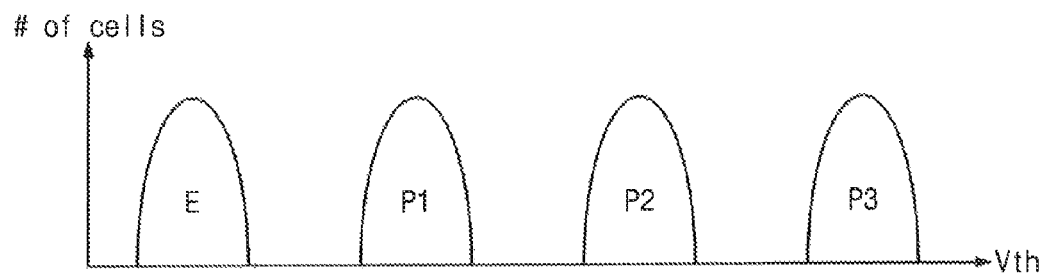
FIG. 5 is a diagram illustrating a threshold voltage distribution of memory cells shown in FIG. 4, according to an exemplary embodiment of the inventive concept.

FIG. 5 is a diagram illustrating a threshold voltage distribution of memory cells shown in FIG. 4, according to an exemplary embodiment of the inventive concept. FIG. 5 shows a threshold voltage distribution of memory cells each of which stores 2-bit data. In FIG. 5, the abscissa represents a threshold voltage Vth, and the ordinate represents the number of memory cells. A memory cell may have one of four states E, P1, P2, and P3 according to its threshold voltage. In FIG. 5, "E" represents an erase state, and "P1", "P2", and "P3" represent program states.

Figure 6:
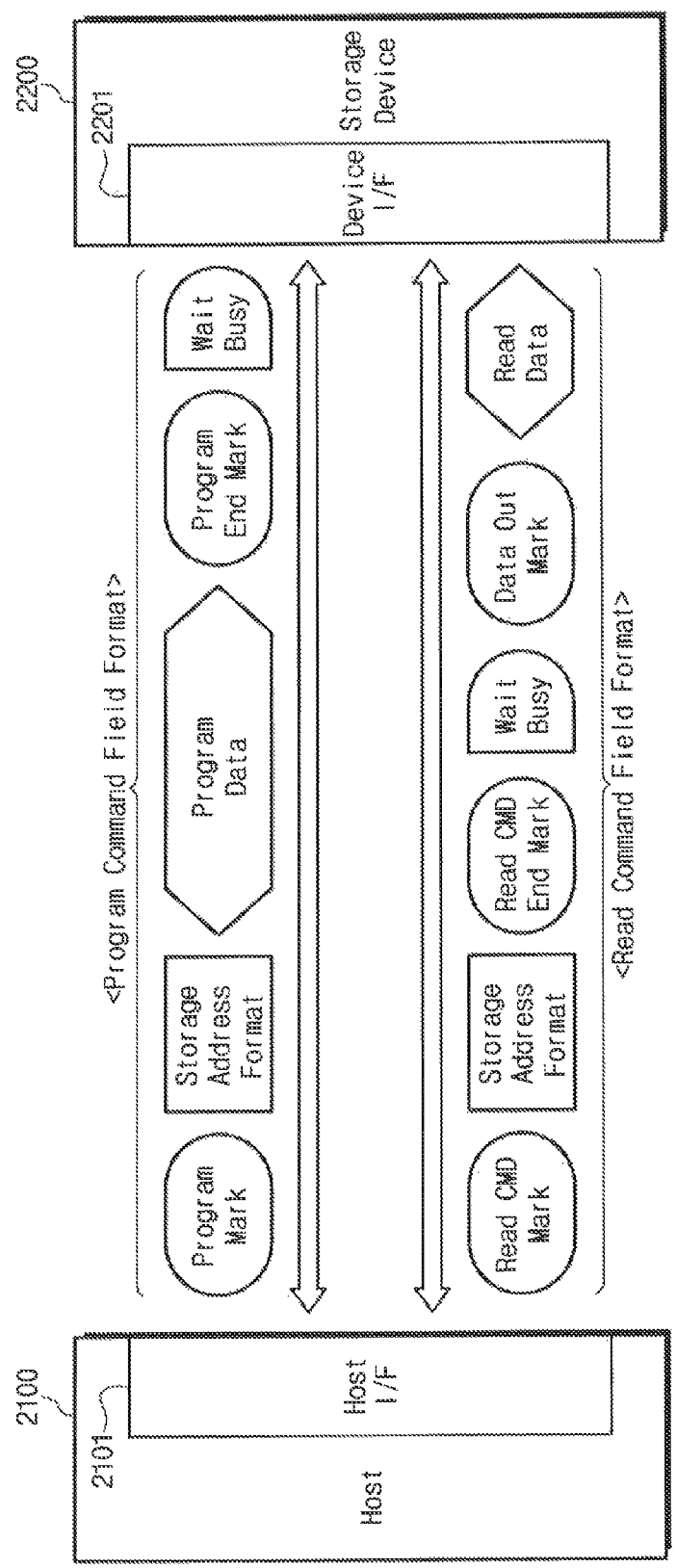
FIG. 6 is a diagram illustrating a command field format of a user device shown in FIG. 2, according to an exemplary embodiment of the inventive concept.

FIG. 6 is a diagram illustrating a command field format of a user device shown in FIG. 2, according to an exemplary embodiment of the inventive concept. A command field format is an interfacing standard that allows information to be exchanged between a host interface 2101 of a host 2100 and a device interface 2201 of a storage device 2200.

In FIG. 6, there are illustrated a program command field format for writing data at the storage device 2200 and a read command field format for reading data from the storage device 2200.

Referring to FIG. 6, the host 2100 sends the storage device 2200 a program mark indicating a transfer of information for writing. After sending the program mark, the host 2100 sends a storage address format for designating a storage location of program data. The host 2100 transfers a program end mark indicating a program end after transmitting the program data. The storage device 2200 performs a program operation during a wait busy period.

As illustrated in FIG. 6, host 2100 sends the storage device 2200 a read command mark indicating a transfer of information for reading. After sending the read command mark, the host 2100 sends a storage address format for designating a storage location of data and a read command end mark indicating a program end after transmitting the program data.

After the read command end mark is sent, the storage device 2200 performs a read operation during a wait busy period. If the read operation ends, the host 2100 transfers a data out mark and the storage device 2200 outputs data to the host 2100.

Returning to FIG. 2, in the user device 2000 according to an exemplary embodiment of the inventive concept, the storage device 2200 contains the error fix manager 2236, and an FTL is driven on the buffer RAM 2140 of the host 2100. Since the user device 2000 shown in FIG. 2 drives the FTL on the host 2100, the storage device 2200 is provided with a variety of information that influences performance of the flash memory 2210.

If a flash memory-based storage device does not have erase count information about memory blocks, it may operate under a condition that a characteristic of the storage device is worse case.

Thus, in an exemplary embodiment of the inventive concept, erase count information of a memory block may be sent from the host 2100 to the storage device 2200, thereby improving performance of the storage device 2200 and ensuring reliability.

Figure 7:
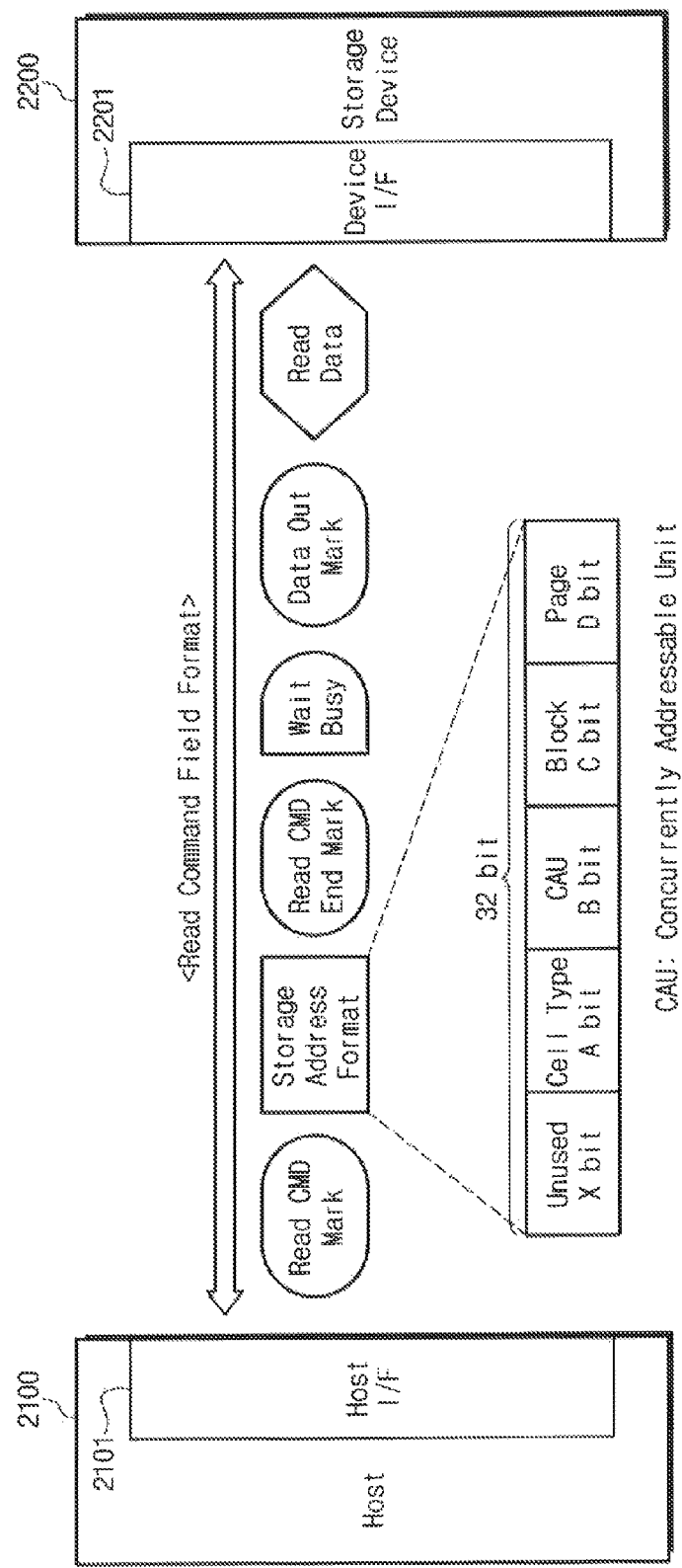
FIGS. 7 and 8 are detailed diagrams of a read command field format and a program command field format shown in FIG. 6, according to an exemplary embodiment of the inventive concept.
Figure 8:
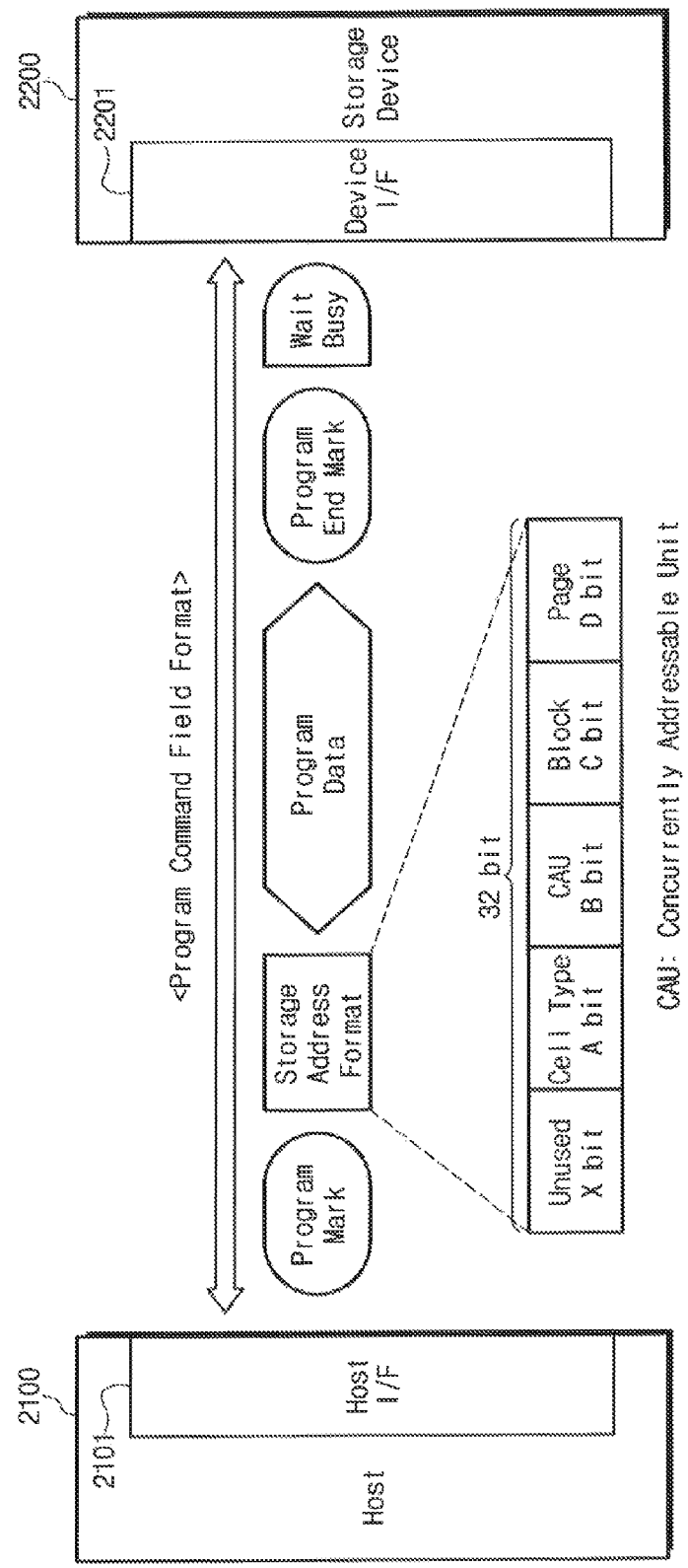

FIGS. 7 and 8 are detailed diagrams of a read command field format and a program command field format shown in FIG. 6, according to an exemplary embodiment of the inventive concept. Referring to FIGS. 7 and 8, a storage address format may be formed of, for example, 32 bits.

An unused area of the storage address format may be formed of "X" bits. A cell type area of the storage address format may be used to indicate whether a read or a write operation is performed with any cell type (e.g., a single level cell (SLC) or a multilevel cell (MLC)) and may be formed of "A" bits. A concurrently addressable unit (CAU) area of the storage address format may be used to designate a data storage location of an upper level such as a chip, a die, or a plane and may be formed of "B" bits. A block area of the storage address format may be used to designate a block number in a CAU and may be formed of "C" bits. A page area of the storage address format may be used to designate a page number in a block and may be formed of "D" bits. In the above-described example, the storage address format may be formed of 32 bits corresponding to a sum of "X" bits and "A" to "C" bits.

Figure 9:
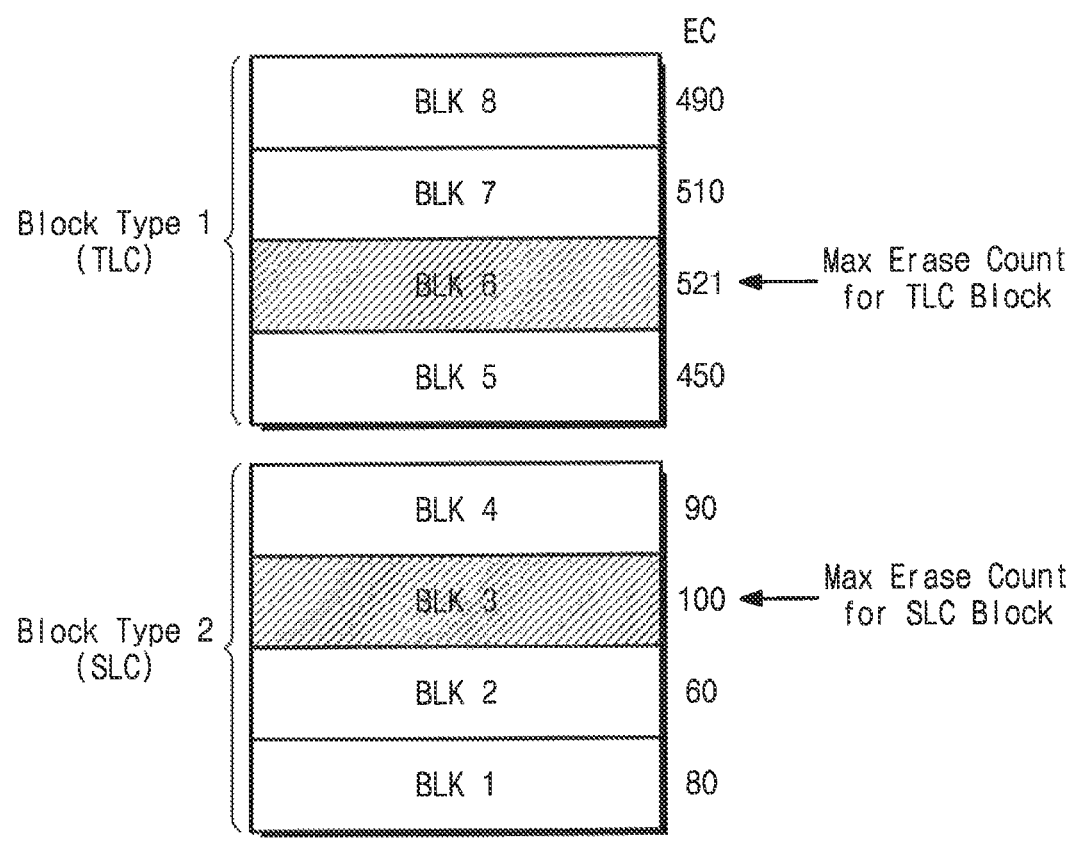
FIG. 9 is a block diagram illustrating a memory cell array of a flash memory shown in FIG. 3, according to an exemplary embodiment of the inventive concept.

FIG. 9 is a block diagram illustrating a memory cell array of a flash memory shown in FIG. 3, according to an exemplary embodiment of the inventive concept. Referring to FIG. 9, the memory cell array may include a plurality of block types. In the example of FIG. 9, a first block type may be a tri-level cell (TLC) block that stores 3 bits per memory cell, and a second block type may be an SLC block that stores one bit per memory cell.

Data that is to be programmed at a memory block with the first block type (e.g., TLC block) may be stored in a memory block with the second block type (e.g., SLC block). Next, there may be performed an operation of moving data from the second block type to the first block type. This operation may be referred to as an on-chip buffered program operation.

Referring to FIG. 9, the second block type includes first to fourth memory blocks BLK1 to BLK4, and the first block type includes fifth to eighth memory blocks BLK5 to BLK8. Each memory block may have an erase count EC.

For example, erase counts of the first to fourth memory blocks BLK1 to BLK4 may be 80, 60, 100, and 90, respectively. A max erase count of an SLC block may be an erase count of the third memory block BLK3: 100. Erase counts of the fifth to eighth memory blocks BLK5 to BLK8 may be 450, 521, 510, and 490, respectively. A max erase count of a TLC block may be an erase count of the sixth memory block BLK6: 521.

When the flash memory 2210 (refer to FIG. 3) iterates a program-erase operation, a characteristic of a threshold voltage distribution may get worse due to deterioration of memory cells. For example, a read fail may arise when a threshold voltage distribution of the memory cells varies. For this reason, a permissible limit of a program-erase (PIE) operation for the flash memory 2210 may be determined. This may be referred to as P/E cycle endurance, The P/E cycle endurance may vary with the number of data bits stored in a memory cell. In general, as the number of data bits stored in a memory cell decreases, the more the P/E cycle endurance increases.

The user device 2000 (refer to FIG. 2) may manage erase counts of memory blocks using the host FTL 2140 of the host 2100 (refer to FIG. 2). The user device 2000 may provide erase count information of each memory block to the storage device 2200 from the host 2100, thereby improving performance of the storage device 2200 and elongating its lifetime.

For example, the storage device 2200 may adjust a read voltage level of the flash memory 2210 based on erase count information received from the host 2100. The storage device 2200 may cope with a variation in a threshold voltage due to the deterioration of its memory cells by adjusting a read voltage level of the flash memory 2210 according to an erase count. In other words, using the erase count, the storage device 2200 may reduce a read fail of the flash memory 2210 and elongate the lifetime of the flash memory 2210.

Figure 10:
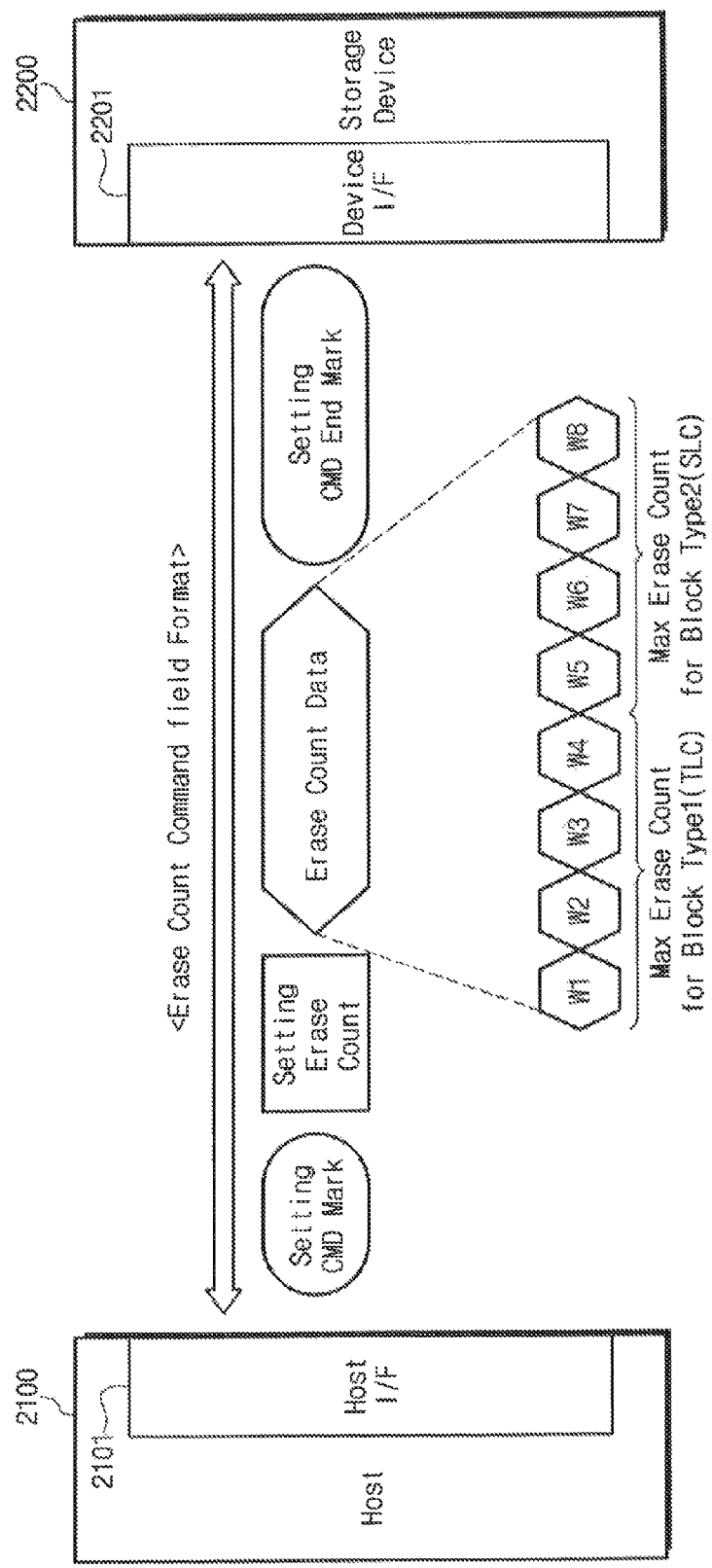
FIG. 10 is a diagram for describing an erase count transferring method of a user device according to an exemplary embodiment of the inventive concept.

FIG. 10 is a diagram for describing a method for transferring an erase count of a user device according to an exemplary embodiment of the inventive concept. In FIG. 10, there is illustrated an erase count command field format that allows a host 2100 to transfer an erase count to a storage device 2200. Information is exchanged between a host interface 2101 of the host 2100 and a device interface 2201 of the storage device 2200.

Here, the host 2100 transfers the storage device 2200 a setting command mark indicating it is time to set the storage device 2200 to receive an erase count. A setting erase count corresponding to a storage address format is send following a transfer of the setting command mark. Following a transfer of the setting erase count, a max erase count is transmitted which includes max erase counts of first and second block types (refer to FIG. 9). Then, there is sent a setting command end mark representing that command setting is terminated.

As illustrated in FIG. 10, erase count data may contain first to fourth data W1 to W4 including the max erase count of the first block type and fifth to eighth data W5 to W8 including the max erase count of the second block type. Here, the first block type may mean a TLC block, and the second block type may mean an SLC block.

Figure 11:
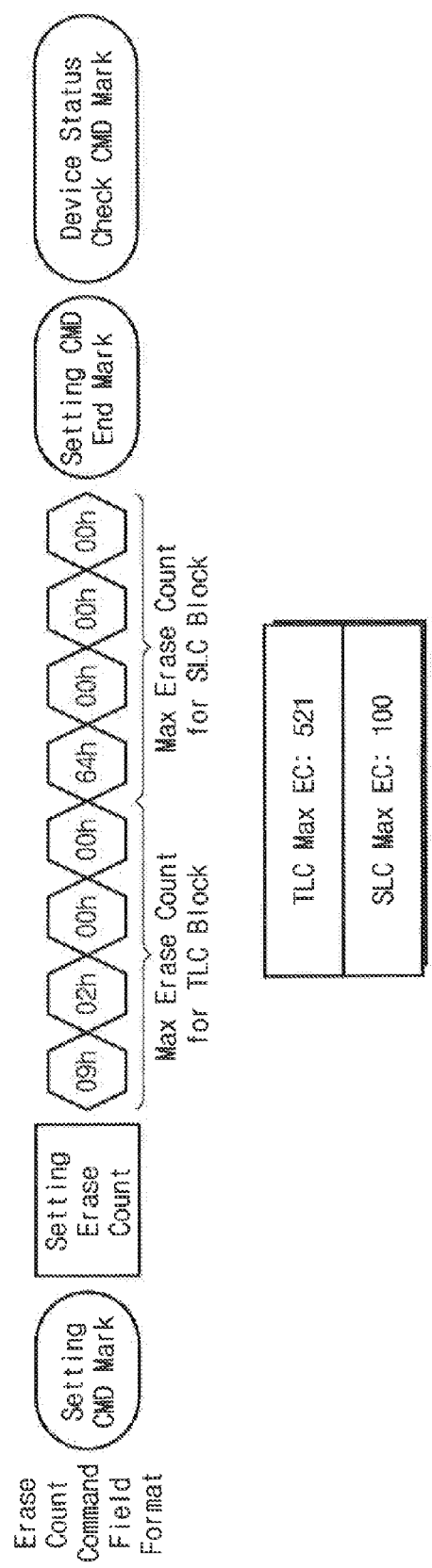
FIG. 11 is a diagram for describing an erase count transferring method shown in FIG. 10, according to an exemplary embodiment of the inventive concept.

FIG. 11 is a diagram for describing an erase count transferring method shown in FIG. 10, according to an exemplary embodiment of the inventive concept. Sending a setting erase count corresponding to a storage address format after a transfer of a setting command mark, the host 2100 may transmit max erase counts corresponding to two block types. In FIG. 11, a max erase count for a TLC block is 521, and a max erase count for an SLC block is 100.

The host 2100 sends a device status check command mark for checking a status of the storage device 2200 after sending a setting command end mark. Then, the host 2100 checks completion of an erase count transfer operation.

In the user device 2000 according to an exemplary embodiment of the inventive concept, the host 2100 sends a max erase count to the storage device 2200. An erase count may be iteratively transmitted with a constant period (e.g., 100 times). For example, the host 2100 may transmit a max erase count to the storage device 2200 when a max erase count of the SLC block reaches 200 or a max erase count of the TLC block reaches 621. An erase count may be transmitted when the storage device 2200 is booted up.

In the user device 2000 according to an exemplary embodiment of the inventive concept, the host 2100 manages the FTL and sends an erase count to the storage device 2200 according to a specific condition (e.g., a constant period or boot-up). The erase count may be a max erase count of a memory block. In addition, in the case a plurality of block types are provided, the erase count may include max erase counts of respective block types. The storage device 2200 may improve program/read performance of the flash memory 2210 using an erase count transferred from the host 2100.

In an exemplary embodiment of the inventive concept, reprogram information may be sent from a host to a storage device, thereby improving performance of the storage device and ensuring reliability.

Figure 12:
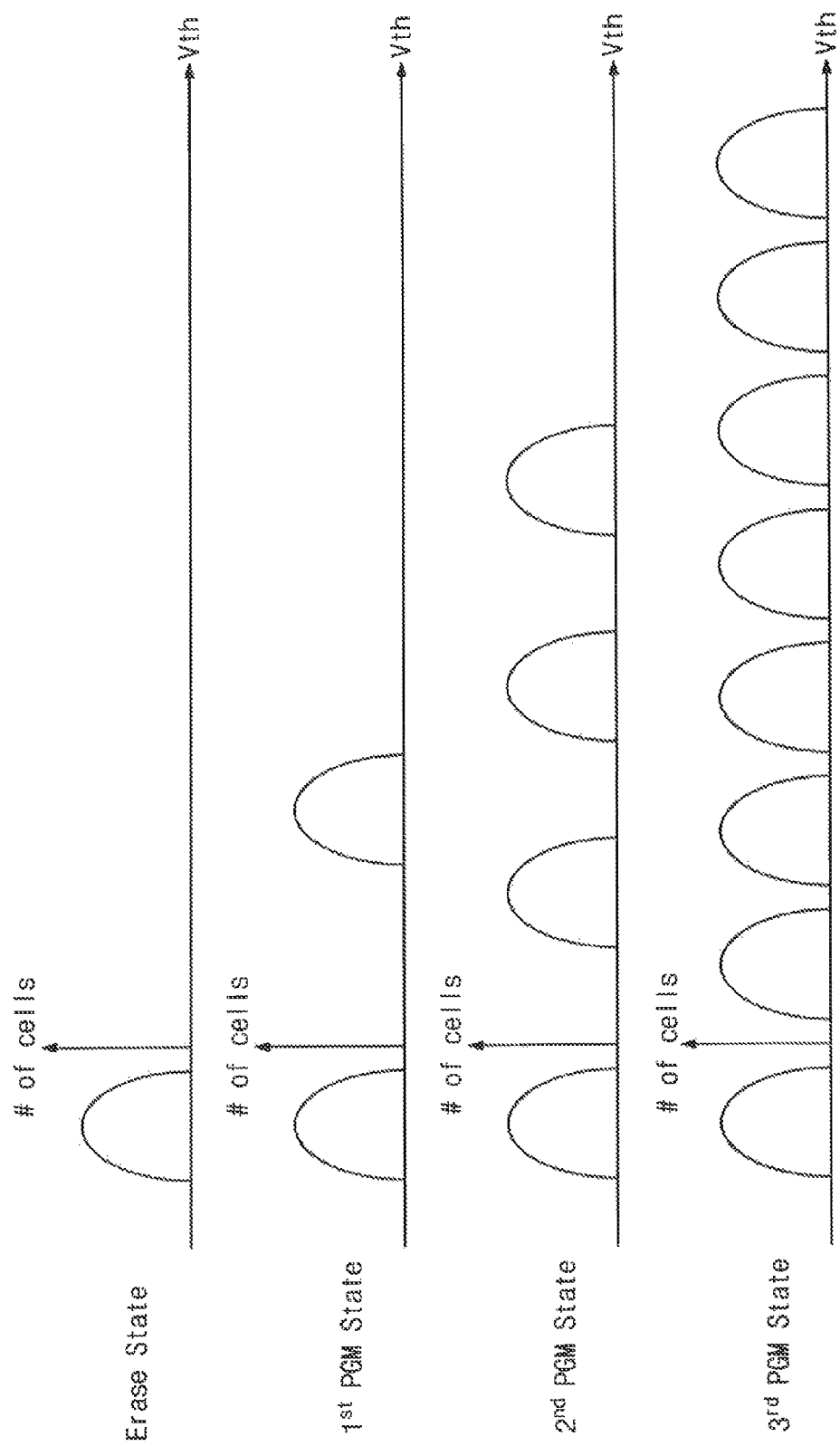
FIGS. 12 and 13 are diagrams illustrating a program method of a flash memory, according to an exemplary embodiment of the inventive concept.
Figure 13:
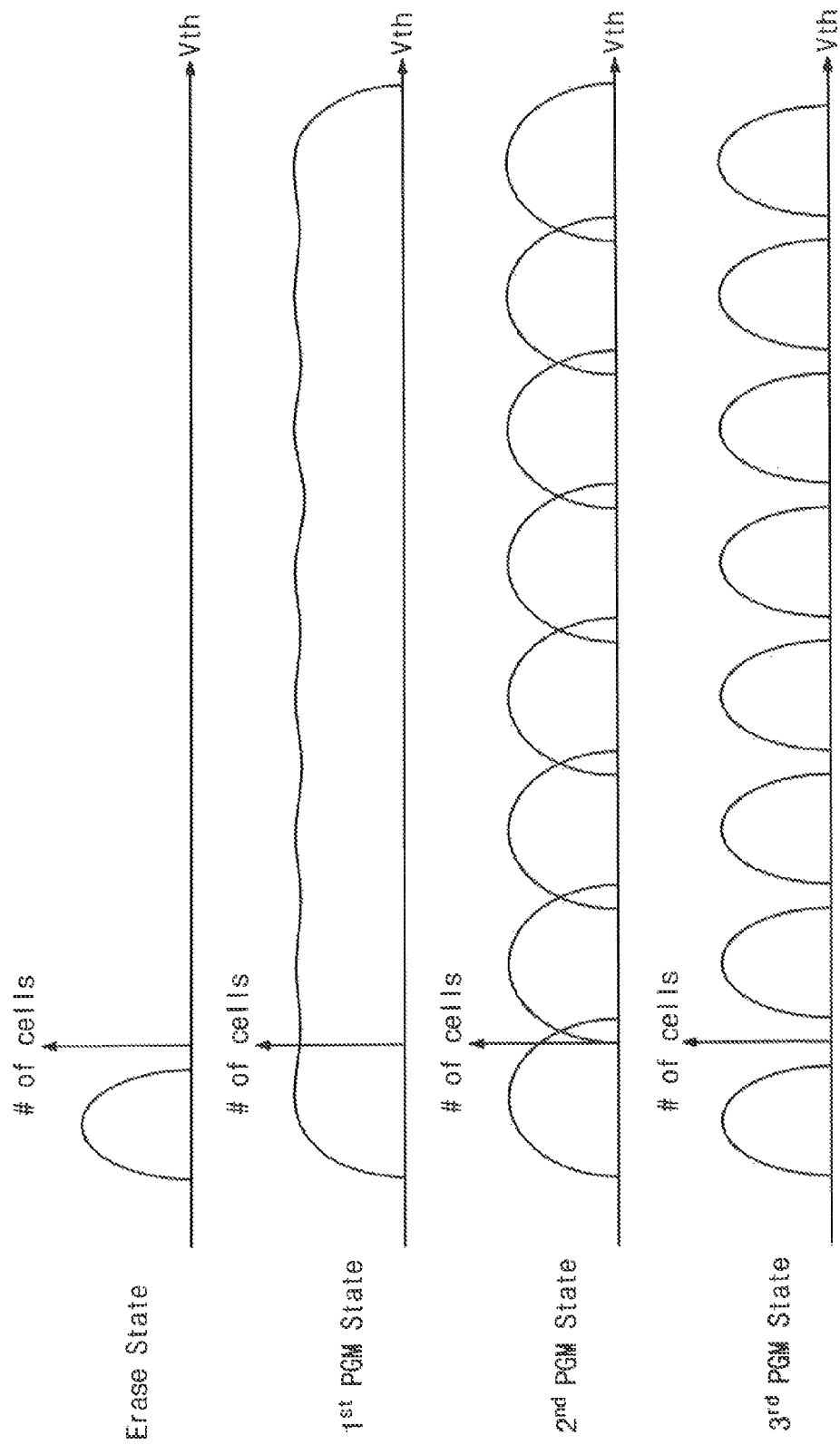

FIGS. 12 and 13 are diagrams illustrating a program method of a flash memory, according to an exemplary embodiment of the inventive concept. FIG. 12 shows program states of a flash memory in which 3-bit data is stored in a memory cell. A flash memory may have eight threshold voltage distributions by performing program operations three times.

A program method shown in FIG. 12 may be a shadow program method that requires a program operation to be performed on a page once, and a program method shown in FIG. 13 may be a reprogram method that requires a program operation to be performed on a page in plural. In FIGS. 12 and 13, the half ovals correspond to threshold voltage distributions.

Referring to FIG. 12, in the shadow program method, a first program state may be achieved from an erase state via a first program operation, and a characteristic of data corresponding to the first program state may be ensured, When a second program state is achieved from the first program state via a second program operation, a characteristic of data corresponding to the second program state may also be ensured. A third program state may be obtained via a third program operation. At this time, eight threshold voltage distributions may be formed.

Referring to FIG. 13, in the reprogram method, characteristics of data corresponding to first and second program states may not be ensured. This can be gleaned from the overlapping threshold voltage distributions in the second program state, for example. In other words, the flash memory 2210 (refer to FIG. 2) using the reprogram method has to perform a plurality of program operations on a page to ensure a characteristic of data. Since a program operation on the same page is iterated in the reprogram method, the storage device 2200 (refer to FIG. 2) manages the number of program operations executed.

In the user device 2000 (refer to FIG. 2) according to an exemplary embodiment of the inventive concept, the host 2100 (refer to FIG. 2) may provide the storage device 2200 with reprogram information when the flash memory 2210 is programmed using the reprogram method.

Figure 14:
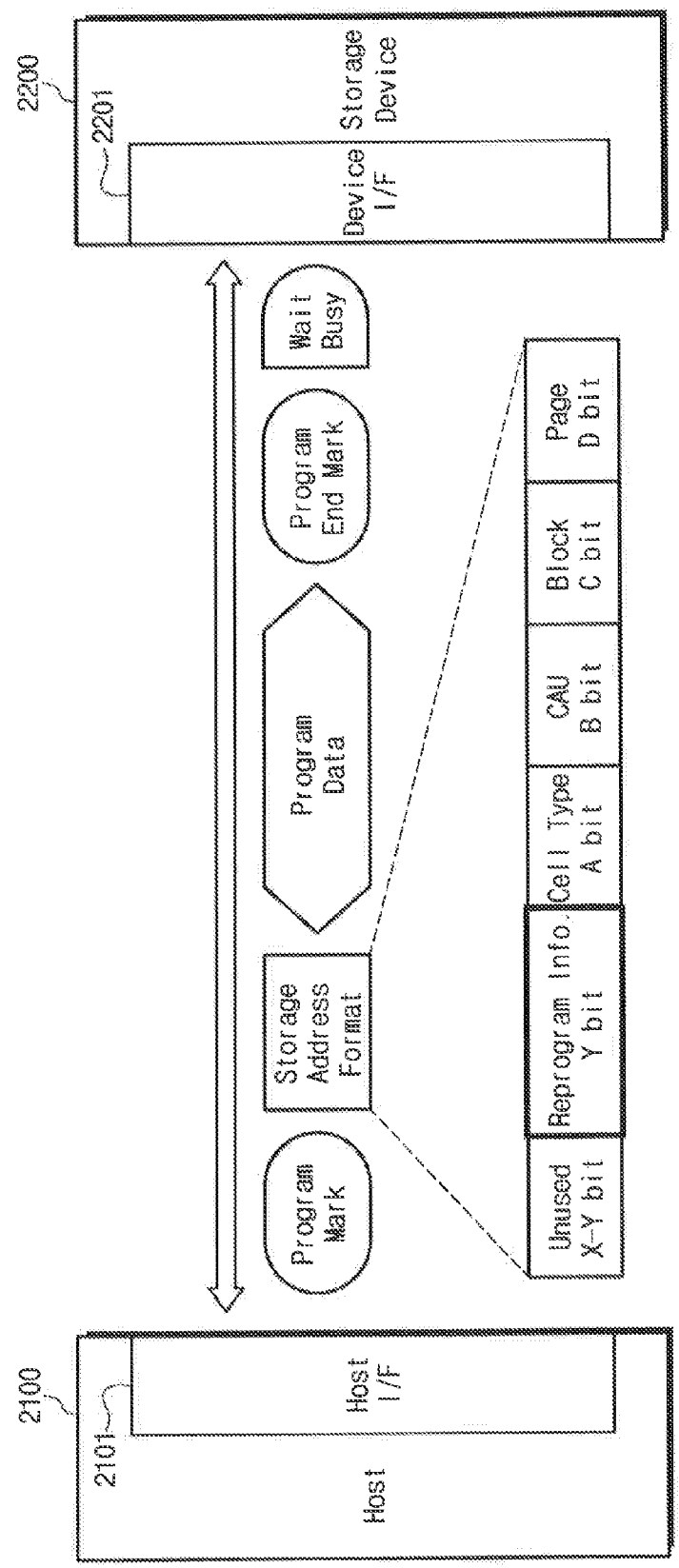
FIG. 14 is a detailed diagram of a storage address format of a program command field format shown in FIGS. 6 and 8, according to an exemplary embodiment of the inventive concept.

FIG. 14 is a detailed diagram of a storage address format of a program command field format shown in FIGS. 6 and 8, according to an exemplary embodiment of the inventive concept.

Referring to FIG. 8, a storage address format may be formed of, for example, 32 bits.

An unused area of the storage address format may be formed of "X" bits. A cell type area of the storage address format may be used to indicate whether a read or a write operation is performed with any cell type (e.g., SLC or MLC) and may be formed of "A" bits. A CAU area of the storage address format may be used to designate a data storage location of an upper level such as a chip, a die, or a plane and may be formed of "B" bits. A block area of the storage address format may be used to designate a block number in a CAU and may be formed of "C" bits. A page area of the storage address format may be used to designate a page number in a block and may be formed of "D" bits. In the above-described example, the storage address format may be formed of 32 bits corresponding to a sum of "X" bits and "A" to "C" bits.

Referring to FIG. 14, the user device 2000 (refer to FIG. 2) transfers reprogram information using a program command field format shown in FIG. 8. A program command field format for transmitting reprogram information is illustrated in FIG. 14. The reprogram information may be included in a storage address format. In other words, the storage address format may contain a reprogram information area as a separate area for transferring reprogram information.

Referring to FIG. 14, the reprogram information area of the storage address format may use "Y" bits of the "X" bits of the unused area of the storage address format. In this case, the unused area of the storage address format may be formed of (X–Y) bits, and the reprogram information area of the storage address format may be formed of "Y" bits. A cell type area of the storage address format may be formed of "A" bits, a CAU area of the storage address format may be formed of "B" bits, a block area of the storage address format may be formed of "C" bits, and a page area of the storage address format may be formed of "D" bits.

Figure 15:
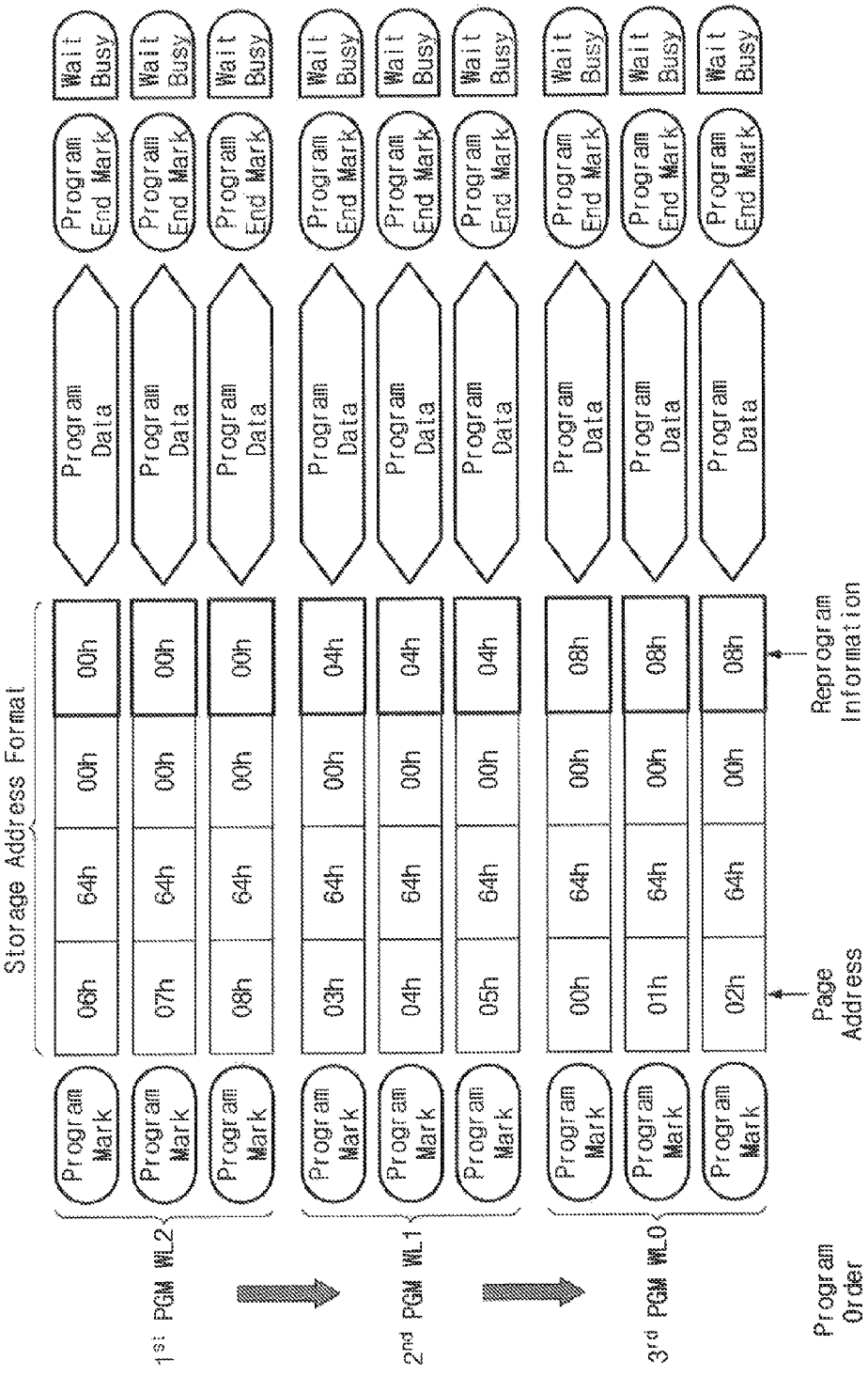

FIGS. 15 and 16 are diagrams for describing a reprogram information transferring method shown in FIG. 14, according to an exemplary embodiment of the inventive concept. The host 2100 sends a program command field format in which a reprogram information area of a storage address format is set with "Y" bits.

Referring to FIG. 15, a first program (1$^{st}$ PGM) operation may be performed when the reprogram information area is set to "00h", a second program operation (2$^{nd}$ PGM) may be performed when the reprogram information area is set to "04h", and a third program operation (3$^{rd}$ PGM) may be performed when the reprogram information area is set to "08h".

FIG. 16 shows a table of page addresses and program orders. Referring to FIGS. 15 and 16, a first program operation (program order 3 in FIG. 16) about WL2 may be performed. The word line WL2 may have page addresses of 06h, 07h, and 08h as illustrated in FIGS. 15 and 16. After the first program operation about WL2 is performed, a second program operation (program order 4 in FIG. 16) about WL1 may be performed. The word line WL1 may have page addresses of 03h, 04h, and 05h as illustrated in FIGS. 15 and 16. After the second program operation about WL1 is performed, a third program operation (program order 5 in FIG. 16) about WL0 may be performed. The word line WL0 may have page addresses of 00h, 01h, and 02h as illustrated in FIGS. 15 and 16. LSB, CSB and MSB in FIG. 16 correspond to least significant bit, center significant bit and most significant bit, respectively.

Figure 17:
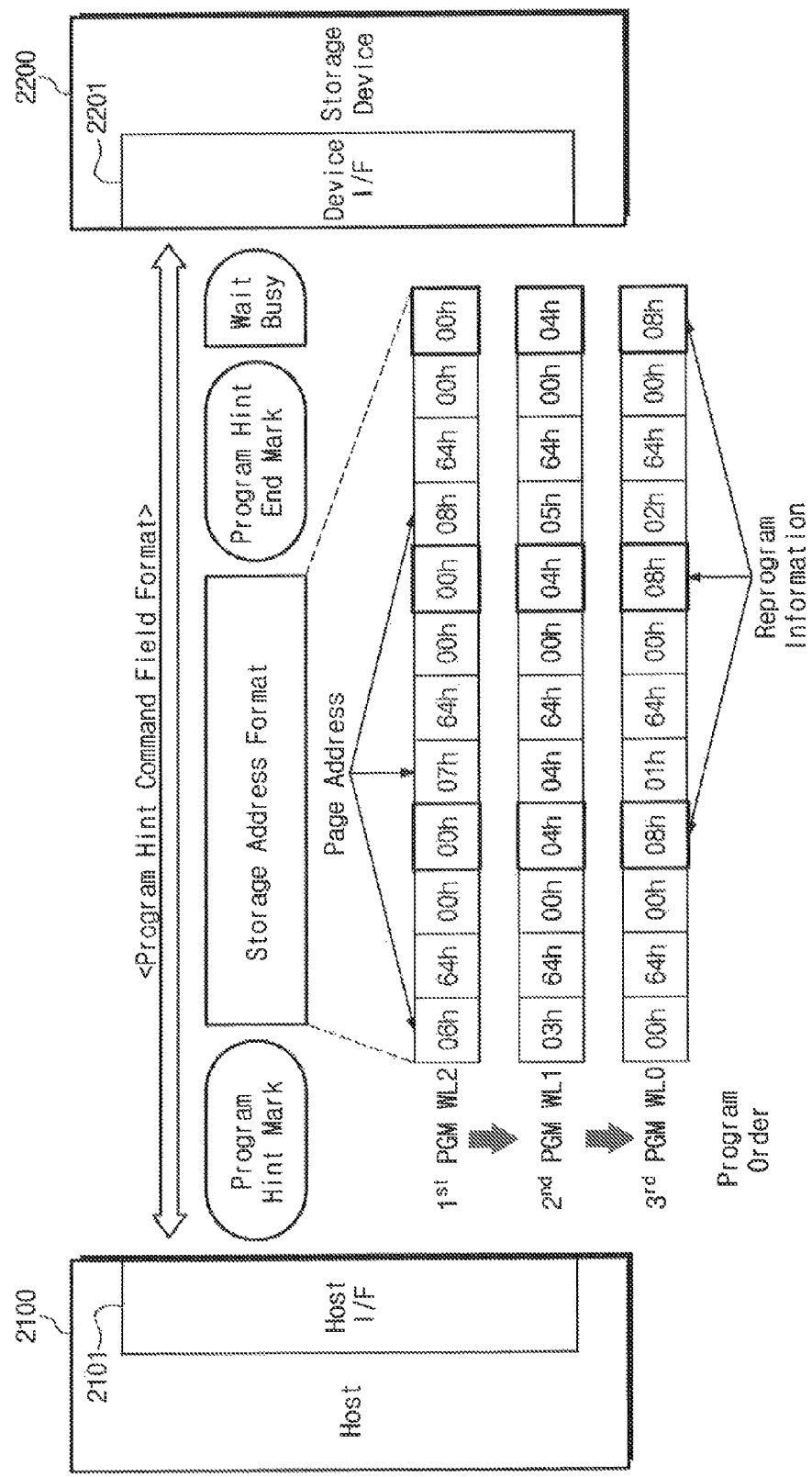
FIG. 17 is a diagram illustrating a reprogram information transferring method of a user device, according to an exemplary embodiment of the inventive concept.

FIG. 17 is a diagram illustrating a reprogram information transferring method of a user device, according to an exemplary embodiment of the inventive concept. The user device 2000 (refer to FIG. 2) may send reprogram information using a program hint command field format.

Prior to a transfer of a program command, the user device 2000 sends a program hint command to transmit a program address from a host 2100 to a storage device 2200. The program hint command may enable the storage device 2200 to grasp program information prior to the transference of the program command, thereby improving program performance. Information is exchanged between a host interface 2101 of the host 2100 and a device interface 2201 of the storage device 2200.

A program hint command field format for transferring reprogram information is illustrated in FIG. 17. Referring to FIG. 17, the program hint command field format contains a program hint mark, a storage address format, and a program hint end mark. The program hint command field format does not include program data.

The reprogram information may be included in the storage address format. A first program operation may be carried out when a reprogram information area of the storage address format is set to 00h, a second program operation may be carried out when the reprogram information area of the storage address format is set to 04h, and a third program operation may be carried out when the reprogram information area of the storage address format is set to 08h. As illustrated in FIG. 15, a program order is: WL2→WL1→WL0. A word line WL2 has page addresses of 06h, 07h, and 08h, a word line WL1 has page addresses of 03h, 04h, and 05h, and a word line WL0 has page addresses of 00h, 01h, and 02h.

When the user device 2000 according to an exemplary embodiment of the inventive concept manages an FTL on the host 2100 and uses a reprogram method, reprogram information may be transferred from the host 2100 to the storage device 2200. The reprogram information may be included in a program command field format or in a storage address format of a program command field format. The storage device 2200 may improve performance of a program operation using reprogram information from the host 2100.

In an exemplary embodiment of the inventive concept, a page offset of an open block may be transferred from a host to a storage device, thereby improving performance of the storage device and ensuring reliability.

Figure 18:
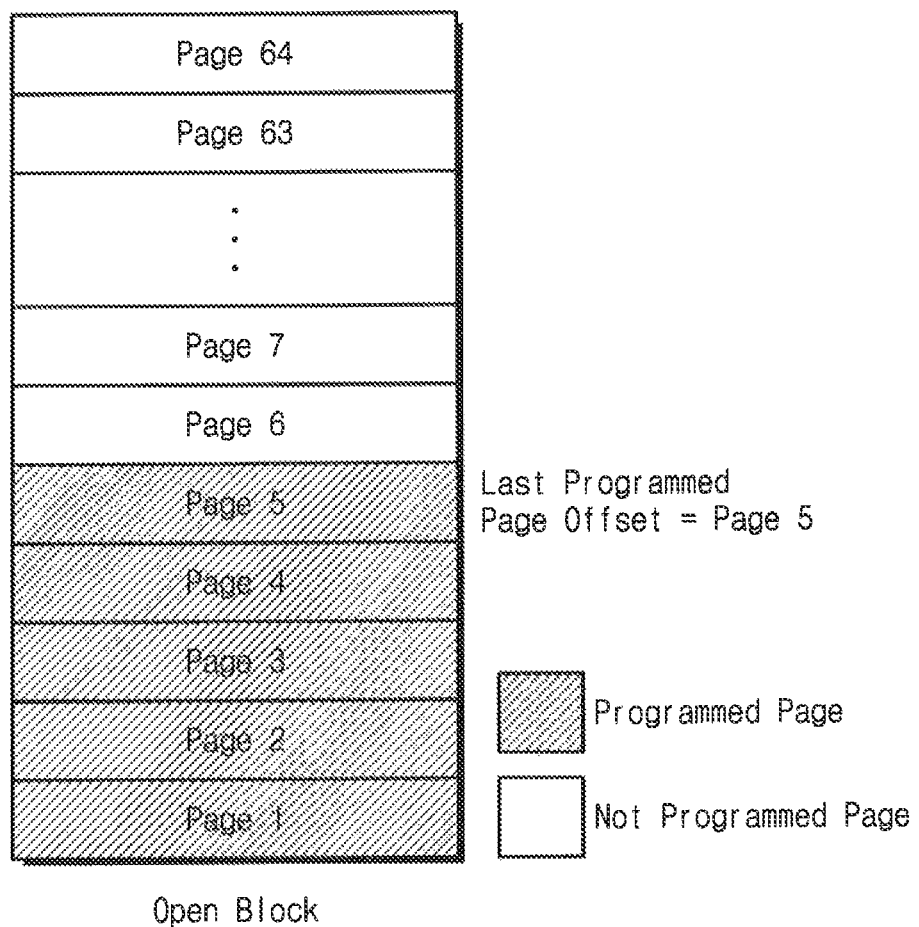
FIG. 18 is a diagram for describing an open block of a flash memory shown in FIG. 3, according to an exemplary embodiment of the inventive concept.

FIG. 18 is a diagram for describing an open block of a flash memory shown in FIG. 3, according to an exemplary embodiment of the inventive concept. A program operation of a memory block may be ended before its storage space is fully filled with data. This memory block may be referred to as an open block. An empty storage space of the memory block may be programmed with data later.

Referring to FIG. 18, a memory block is formed of 64 pages. $1^{st}$ to $5^{th}$ pages are pages that are programmed, and $6^{th}$ to $64^{th}$ pages are pages that are not programmed. The $5^{th}$ page may be a page that is last programmed. A page offset may mean a number of the last programmed page. In FIG. 18, the page offset may be the $5^{th}$ page.

Figure 19:
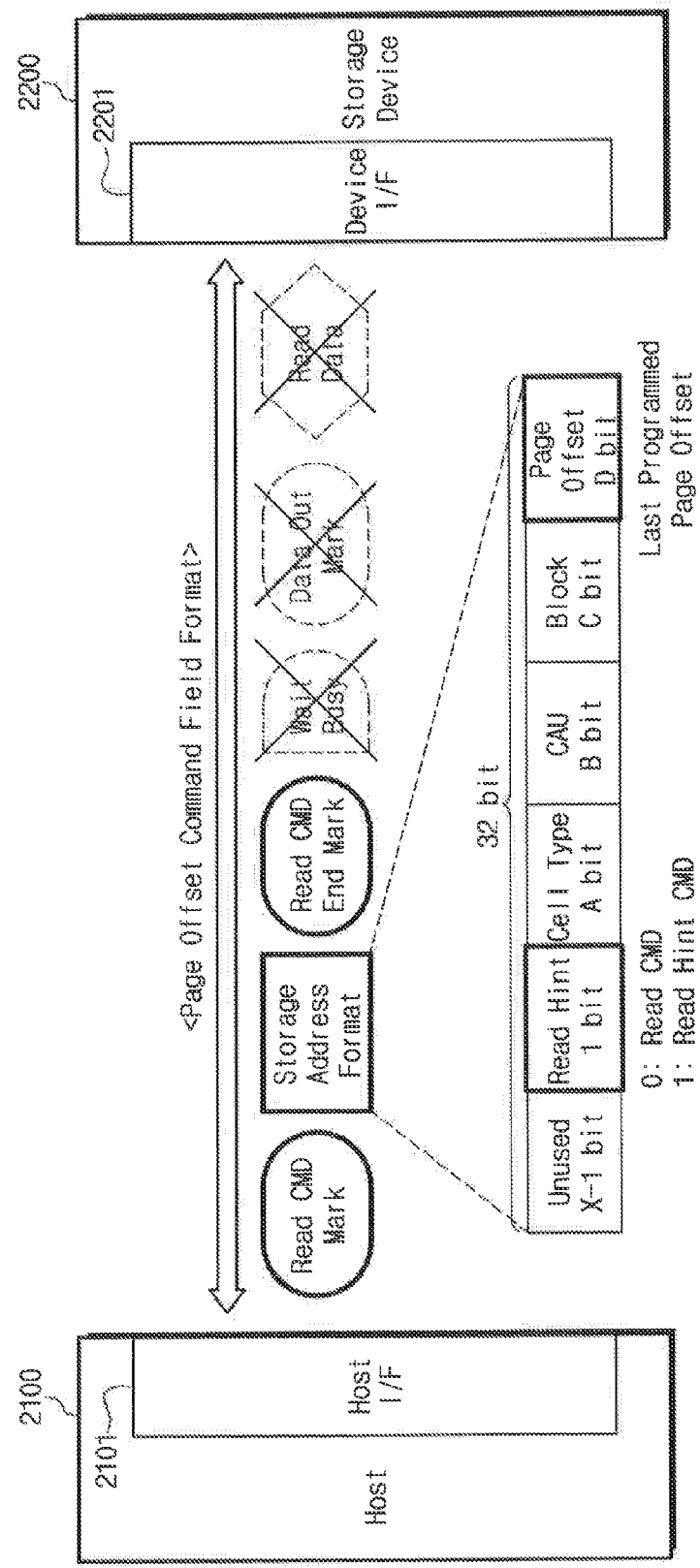
FIG. 19 is a diagram for describing a method of transferring a page offset of an open block in a user device, according to an exemplary embodiment of the inventive concept.

FIG. 19 is a diagram for describing a method of transferring a page offset of an open block in a user device, according to an exemplary embodiment of the inventive concept. A page offset command field format for transferring a page offset of an open block is illustrated in FIG. 19.

A host 2100 transfers a page offset of an open block to a storage device 2200 using a host FTL. Using the page offset of the open block, the storage device 2200 improves program/read performance and ensures reliability of data. Information is exchanged between a host interface 2101 of the host 2100 and a device interface 2201 of the storage device 2200.

Prior to a transfer of a command field format for a read, the host 2100 sends read hint information to the storage device 2200 using a page offset command field format. The read hint information may contain page offset information about a memory block to be read. The page offset command field format need not be provided when a read operation is requested. For example, the page offset command field format may be provided only at a read operation on an open block.

Referring to FIG. 19, the page offset command field format may be used in a manner similar to a read command field format. In other words, the page offset command field format may use a read command mark, a storage address format, and a read command end mark of the read command field format. The page offset command field format may have a format in which data is not output after the read command end mark.

In this case, the host 2100 transmits the storage device 2200 a read command mark representing a transfer of read information to the storage device 2200. After sending the read command mark, the host 2100 transmits a storage address format for reporting a data storage location information and a read command end mark.

In FIG. 19, the storage address format is formed of 32 bits and includes a read hint area and a page offset area.

The read hint area of the storage address format may use one bit of "X" bits of an unused area of the storage address format. In this case, the unused area of the storage address format is formed of (X-1) bits, and the read hint area of the storage address format is formed of one bit. A cell type area of the storage address format is formed of "A" bits, a CAU area of the storage address format is formed of "B" bits, and a block area of the storage address format is formed of "C" bits. A page area shown in FIG. 18 is used as a page offset area of the storage address format and is formed of "D" bits.

Figure 20:
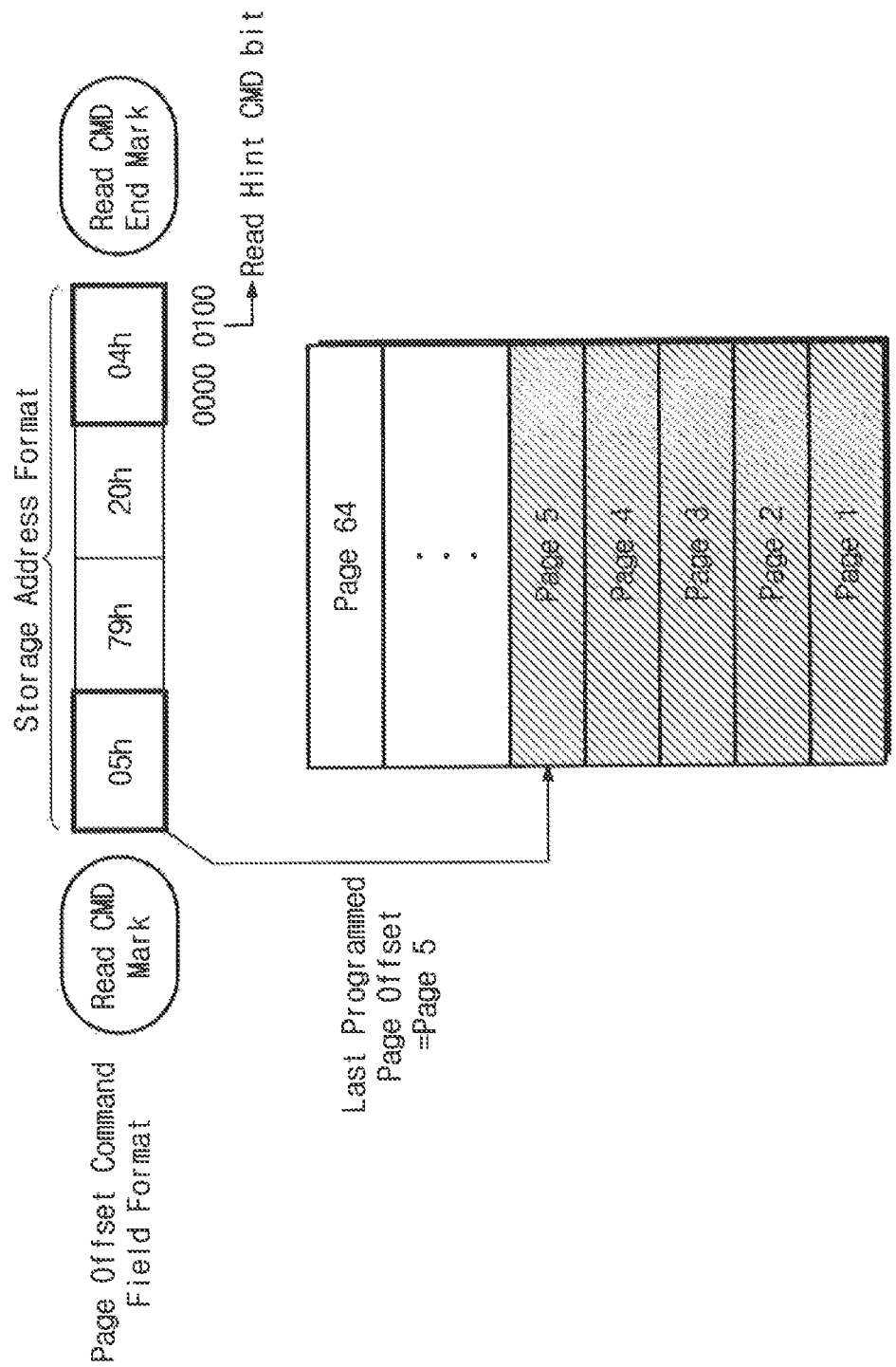
FIG. 20 is a diagram for describing a page offset transferring method shown in FIG. 19, according to an exemplary embodiment of the inventive concept.

FIG. 20 is a diagram for describing a page offset transferring method shown in FIG. 19, according to an exemplary embodiment of the inventive concept. In the case a specific condition is satisfied prior to transferring a read command, the host 2100 transmits a page offset command field format in which a read hint area of a storage address format is set to "1".

A condition by which a read hint command bit of FIG. 19 is set to "1" may be expressed by the following equation (1).

$$A\& (B\|C\|D) \qquad (1)$$

In the equation (1), "&" represents an AND operation, and "∥" represents an OR operation.

Here, a condition A represents the case that a block to be read is an open block. A condition B means a first read operation after a user device is initialized. For example, the condition B represents the case that a power is turned on/off while a read operation is performed after a transfer of a page offset command field format. A condition C represents the case that a memory block is changed in the same CAU. In other words, the condition C represents the case that a read-target block is changed in the same chip or die. A condition D represents the case that a page offset of a read-target block is changed. For example, the condition D represents the case that a read operation is performed after a transfer of a page offset command field format and a last program page offset is changed due to programming a corresponding memory block.

Referring to FIG. 20, "04h" of a storage address format includes a read hint command bit, and "05h" includes a last programmed page offset bit. In FIG. 20, a page offset of an open block may be a fifth page. If a condition expressed by the equation (1) is satisfied, the user device 2000 (refer to FIG. 2) according to an exemplary embodiment of the inventive concept may set a read hint command bit to "1" and a page offset to a fifth page. Afterwards, the user device 2000 sends a page offset command field format to the storage device 2200.

Figure 21:
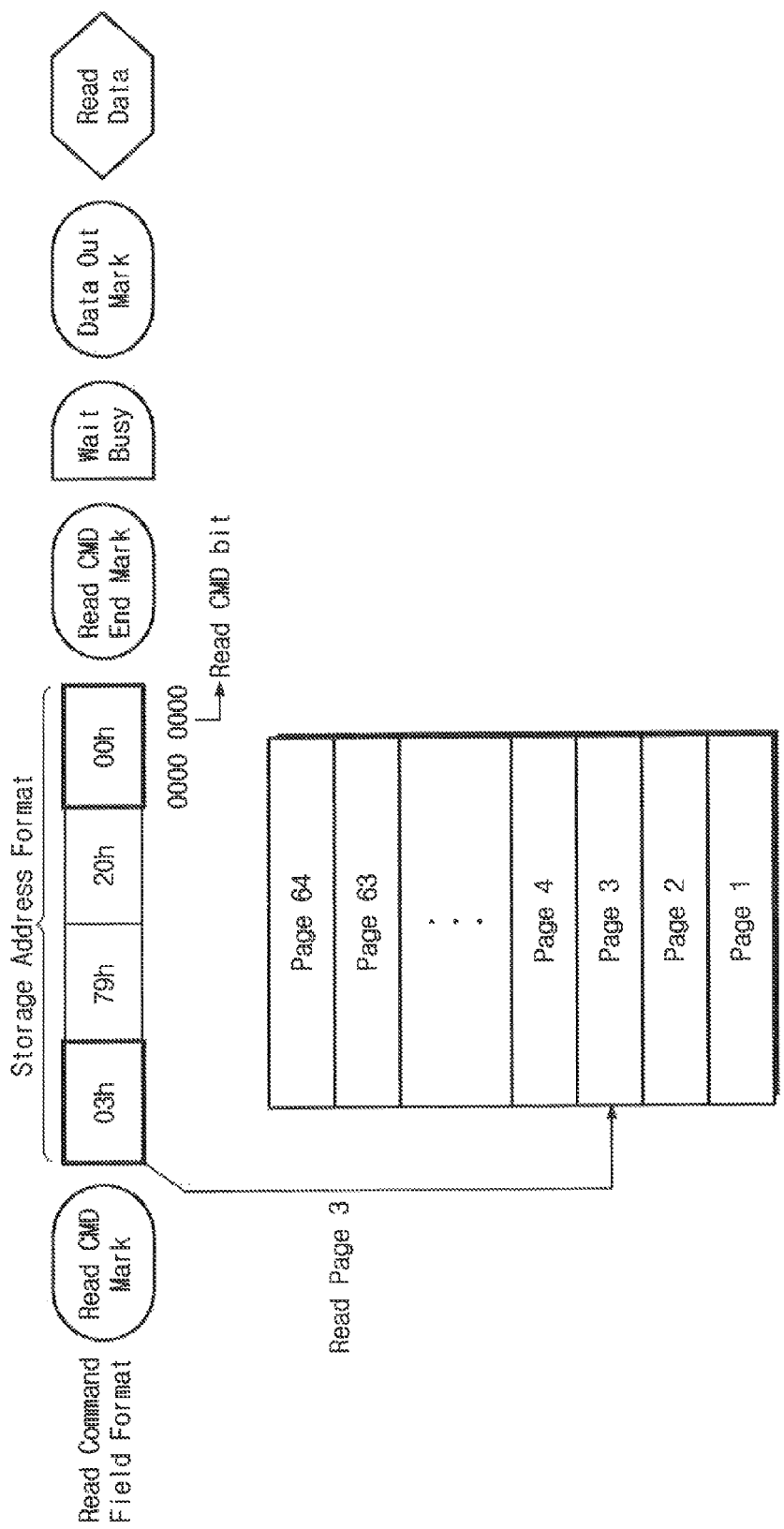
FIG. 21 is a diagram illustrating a normal read operation performed when a read hint area is set to 0, according to an exemplary embodiment of the inventive concept.

FIG. 21 is a diagram illustrating a normal read operation performed when a read hint area is set to 0, according to an exemplary embodiment of the inventive concept. If a condition expressed by the equation (1) is not satisfied, the host 2100 sets a read hint area of FIGS. 19 to "0" and performs a normal read operation.

Referring to FIG. 21, "00h" of a storage address format includes a read command bit, and "03h" of the storage address format includes a page number of a read target. In FIG. 21, a page corresponding to a read target may be a third page. If the condition expressed by the equation (1) is not satisfied, the host 2100 sets a read command bit to "0" and a read-target page to a third page and sends a read command field format to the storage device 2200.

The user device 2000 according to an exemplary embodiment of the inventive concept manages a FTL on the host 2100, and if a specific condition is satisfied, the user device 2000 sends a read hint command to the storage device 2200 prior to a transfer of a read command. The read hint command may include page offset information of an open block. The read hint command has a page offset command field format similar to a read command field format, thereby preventing a drop off in performance. The storage device 2200 may improve program/read performance using page offset information from the host 2100.

Not only is a user device according to an exemplary embodiment of the inventive concept applicable to a two-dimensional flash memory, but it is also applicable to a three-dimensional (3D) flash memory.

Figure 22:
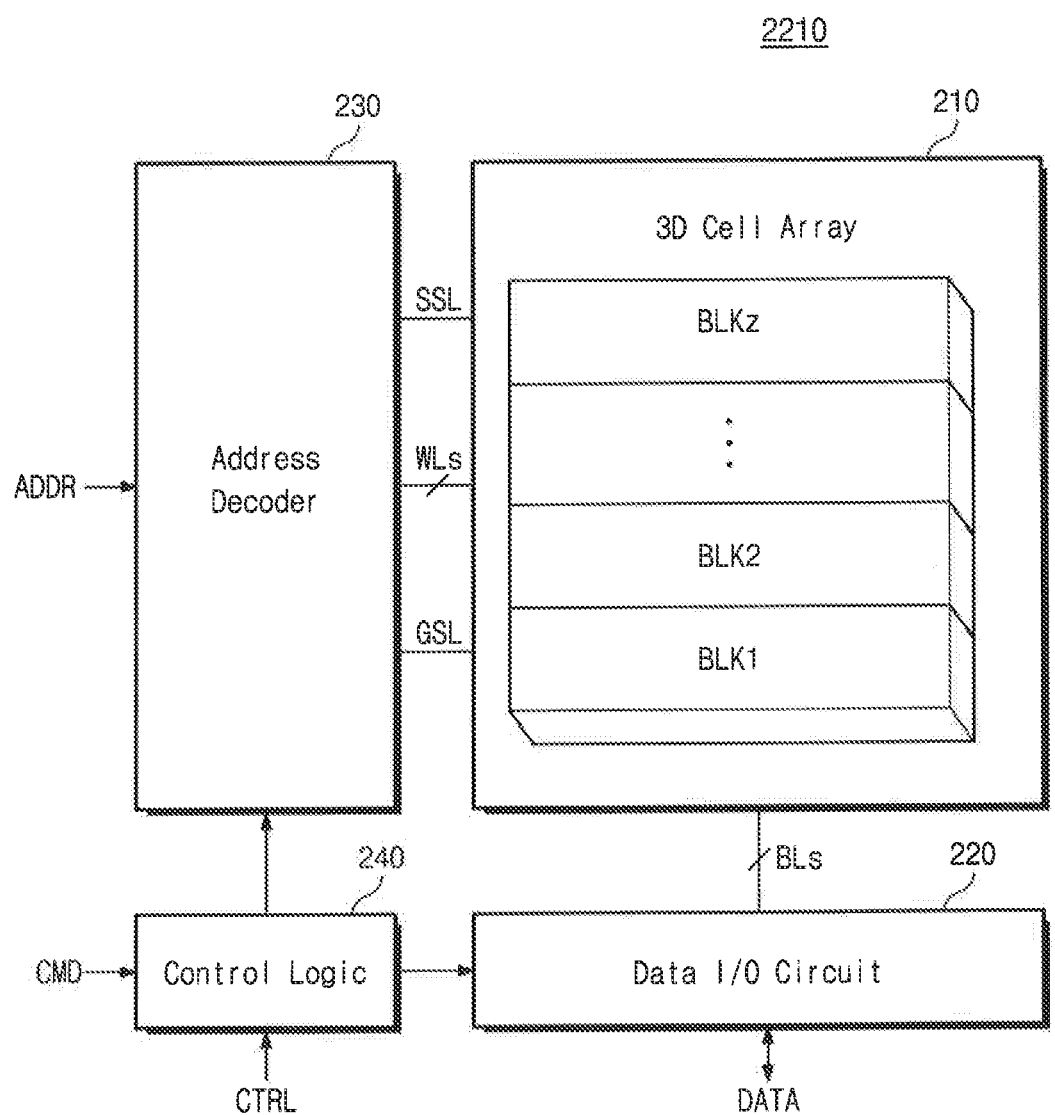
FIG. 22 is a block diagram illustrating a flash memory used in an exemplary embodiment of the inventive concept.

FIG. 22 is a block diagram illustrating a flash memory used in an exemplary embodiment of the inventive concept. Referring to FIG. 22, a flash memory 2210 may include a 3D cell array 210, a data input/output circuit 220, an address decoder 230, and control logic 240.

The data input/output circuit 220 is connected with the 3D cell array 210 via a plurality of bit lines BLs. The data input/output circuit 220 receives data DATA from an external device or outputs data read from the 3D cell array 210 to the external device. The address decoder 230 is connected with the 3D cell array 210 via a plurality of word lines WLs and selection lines GSL and SSL. The address decoder 230 selects a word line in response to an address ADDR.

The control logic 240 controls operations of the flash memory 2210 including a read operation, a program operation, an erase operation, and so on. For example, at a program operation, the control logic 240 controls the address decoder 230 such that a program voltage is supplied to a selected word line and the data input/output circuit 220 such that data is programmed. The control logic 240 controls programming, erasing, and reading of the flash memory 2210 based on a control signal CTRL from the device controller 2230 (refer to FIG. 2). The control logic 240 may receive a corresponding command CMD from the device controller 2230 (refer to FIG. 2).

Figure 23:
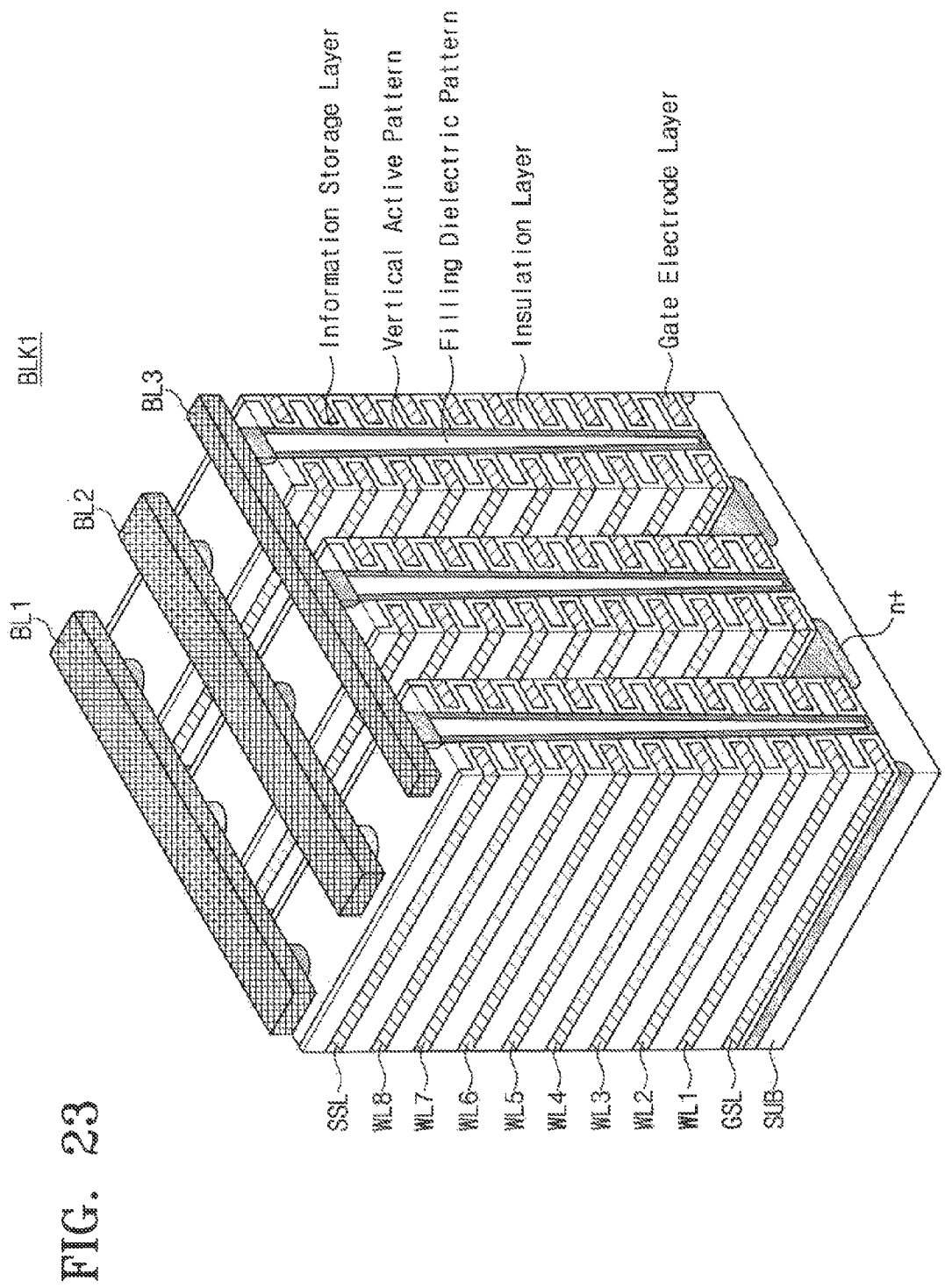
FIG. 23 is a perspective view illustrating a three dimensional (3D) structure of a memory block illustrated in FIG. 22, according to an exemplary embodiment of the inventive concept.

FIG. 23 is a perspective view illustrating a 3D structure of a memory block illustrated in FIG. 22, according to an exemplary embodiment of the inventive concept. Referring to FIG. 23, a memory block BLK1 is formed in a direction perpendicular to a substrate SUB. An n+ doping region is formed in the substrate SUB. A gate electrode layer and an insulation layer are repeatedly deposited above the substrate SUB. An information storage layer is formed between the gate electrode layers and the insulation layers.

V-shaped pillars are formed when the gate electrode layer and the insulation layer are patterned in a vertical direction. The pillars are in contact with the substrate SUB via the gate electrode layers and the insulation layers. In each pillar, an outer portion may be a vertical active pattern and be formed of a channel semiconductor and an inner portion may be a filling dielectric pattern and be formed of an insulation material such as silicon oxide.

The gate electrode layers of the memory block BLK1 may be connected with a ground selection line GSL, a plurality of word lines WL1 to WL8, and a string selection line SSL. The pillars of the memory block BLK1 are connected with a plurality of bit lines BL1 to BL3. In FIG. 23, one memory block BLK1 is illustrated as having two selection lines SSL and GSL, eight word lines WL1 to WL8, and three bit lines BL1 to BL3. However, the inventive concept is not limited thereto.

Figure 24:
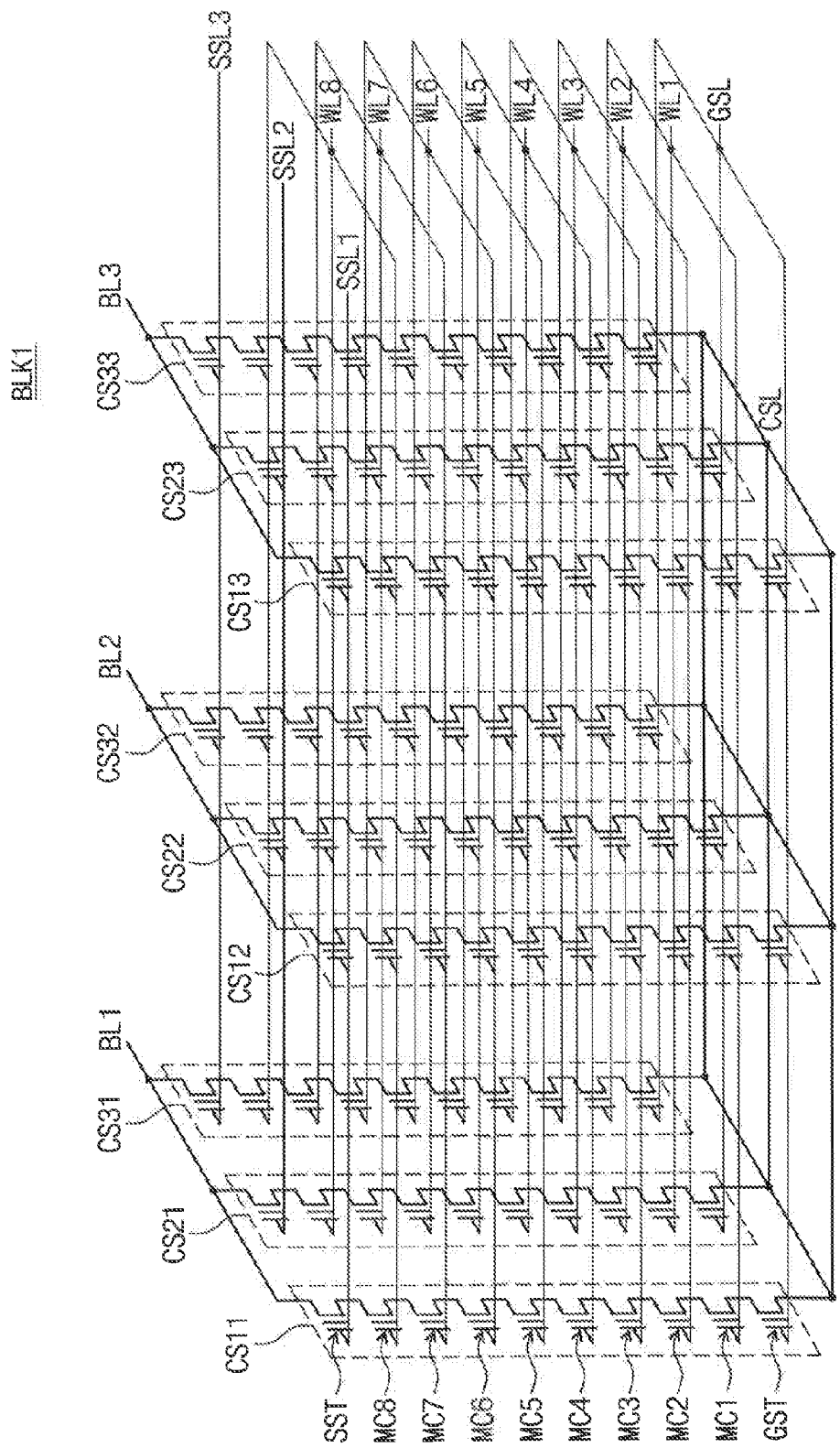
FIG. 24 is a circuit diagram illustrating an equivalent circuit of a memory block illustrated in FIG. 23, according to an exemplary embodiment of the inventive concept.

FIG. 24 is a circuit diagram illustrating an equivalent circuit of a memory block BLK1 illustrated in FIG. 23, according to an exemplary embodiment of the inventive concept. Referring to FIG. 24, cell strings CS11 to CS33 are connected between bit lines BL1 to BL3 and a common source line CSL. Each cell string (e.g., CS11) includes a string selection transistor SST, a plurality of memory cells MC1 to MC8, and a ground selection transistor GST.

The string selection transistors SST are connected with string selection lines SSL1 to SSL3. The memory cells MC1 to MC8 are connected with corresponding word lines WL1 to WL8, respectively. The ground selection transistors GST are connected with a ground selection line GSL. In each cell string, the string selection transistor SST is connected with a bit line, and the ground selection transistor GST is connected with the common source line CSL.

Memory cells MC1 to MC8 are connected to corresponding word lines WL1 to WL8, and a group of memory cells that are connected to a word line and are simultaneously programmed and are named a page. The memory block BLK1 is constituted by a plurality of pages. In addition, a word line is connected with a plurality of pages. Referring to FIG. 24, a word line (e.g., WL4) with the same distance from the common source line CSL may be connected in common to three pages.

A user device according to an exemplary embodiment of the inventive concept may be applied to or used in various products. The user device according to an exemplary embodiment of the inventive concept may be implemented in electronic devices, such as, but not limited to, a PC, a digital camera, a camcorder, a handheld phone, an MP3 player, a portable media player (PMP), a playstation portable (PSP), a personal digital assistant (PDA), and so on. A storage medium of the user device may be implemented with storage devices, such as, but not limited to, a memory card, a universal serial bus (USB) memory, a solid state drive (SSD), and so on.

Figure 25:
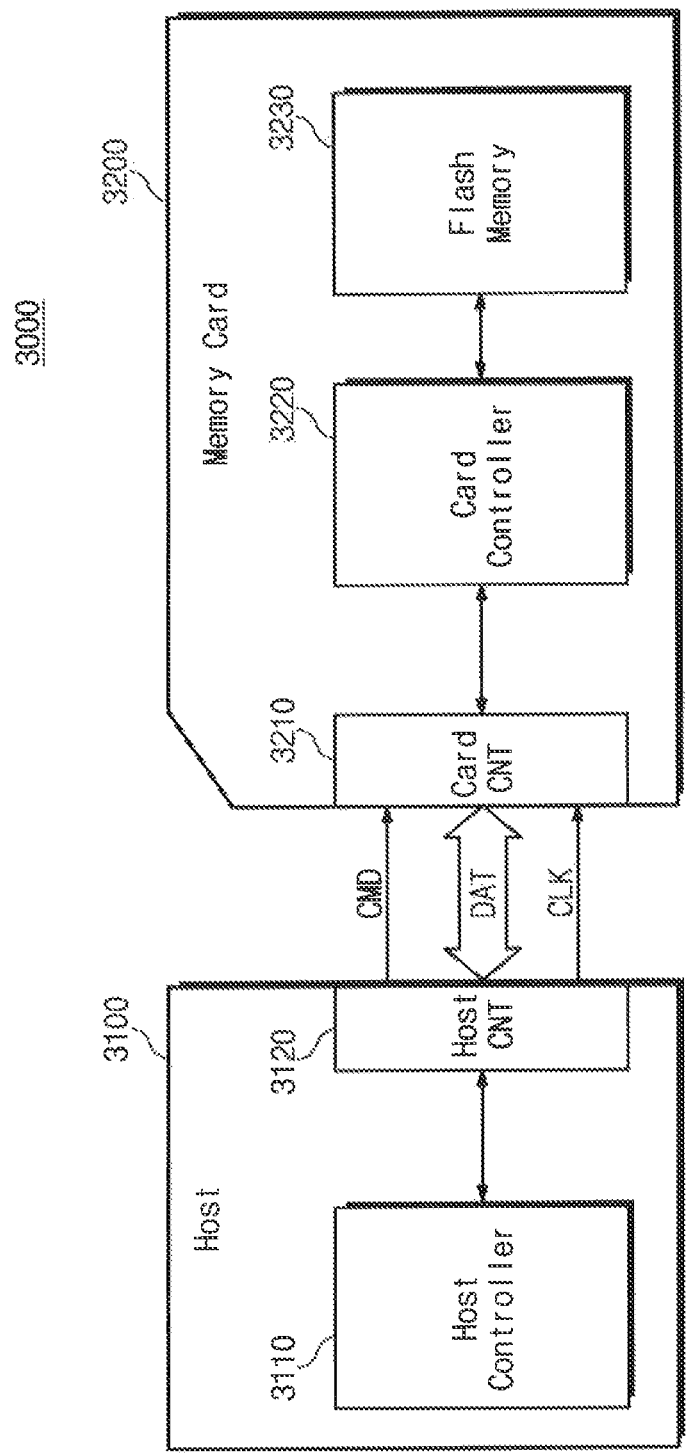
FIG. 25 is a block diagram illustrating a memory card to which a storage device of a user device according to an exemplary embodiment of the inventive concept is applied.

FIG. 25 is a block diagram illustrating a memory card to which a storage device of a user device according to an exemplary embodiment of the inventive concept is applied. A memory card system 3000 includes a host 3100 and a memory card 3200. The host 3100 contains a host controller 3110 and a host connection unit 3120. The memory card 3200 includes a card connection unit 3210, a card controller 3220, and a flash memory 3230.

The host 3100 writes data at the memory card 3200 and reads data from the memory card 3200. The host controller 3110 sends a command (e.g., a write command), a clock signal CLK generated from a clock generator (not shown) in the host 3100, and data to the memory card 3200 through the host connection unit 3120.

The card controller 3220 stores data at the flash memory 3230 in response to a command input through the card connection unit 3210. The data is stored in synchronization with a clock signal generated from a clock generator (not shown) in the card controller 3220. The flash memory 3230 stores data transferred from the host 3100. For example, in a case where the host 3100 is a digital camera, the memory card 3200 may store image data.

Figure 26:
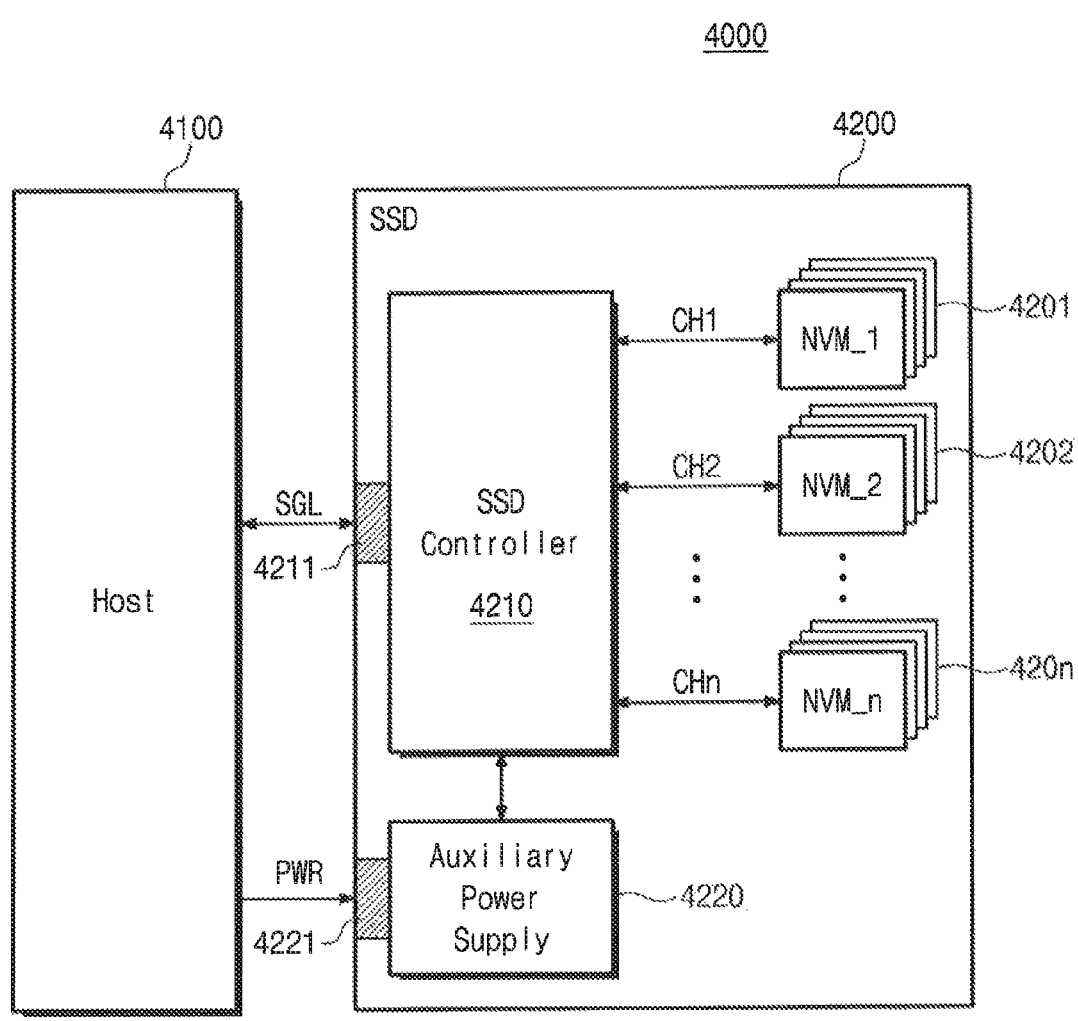
FIG. 26 is a block diagram illustrating a solid state drive (SSD) to which a storage device according to an exemplary embodiment of the inventive concept is applied.

FIG. 26 is a block diagram illustrating an SSD to which a storage device according to an exemplary embodiment of the inventive concept is applied. Referring to FIG. 26, an SSD system 4000 includes a host 4100 and an SSD 4200.

The SSD 4200 exchanges signals SGL with the host 4100 through a signal connector 4211 and is supplied with a power PWR through a power connector 4221. The SSD 4200 includes a plurality of flash memories 4201 to 420$n$, an SSD controller 4210, and an auxiliary power supply 4220.

The plurality of flash memories 4201 to 420$n$ may be used as a storage medium of the SSD 4200. Not only may the SSD 4200 employ the flash memory, but it may employ other nonvolatile memory devices. The flash memories 4201 to 420$n$ are connected with the SSD controller 4210 through a plurality of channels CH1 to CHn. One channel is connected with one or more flash memories. Flash memories connected with one channel may be connected with the same data bus.

The SSD controller 4210 exchanges the signals SGL with the host 4100 through the signal connector 4211. The signals SGL may include a command, an address, data, and so on. The SSD controller 4210 is adapted to write or read out data to or from a corresponding flash memory according to a command of the host 4100. The SSD controller 4210 will be more fully described with reference to FIG. 27.

The auxiliary power supply 4220 is connected with the host 4100 through the power connector 4221. The auxiliary power supply 4220 is charged by the power PWR from the host 4100. The auxiliary power supply 4220 may be placed inside or outside the SSD 4200. For example, the auxiliary power supply 4220 may be put on a main board to supply an auxiliary power to the SSD 4200.

Figure 27:
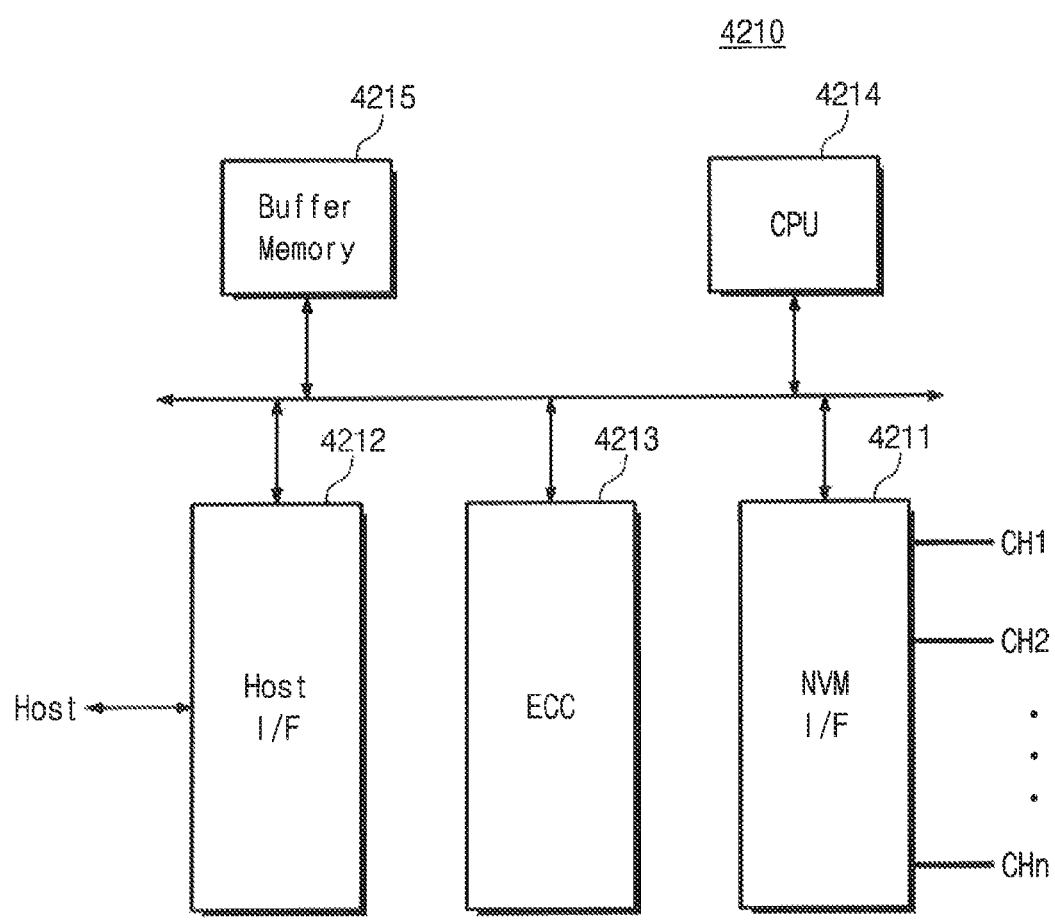
FIG. 27 is a block diagram illustrating an SSD controller shown in FIG. 26, according to an exemplary embodiment of the inventive concept.

FIG. 27 is a block diagram illustrating an SSD controller shown in FIG. 26, according to an exemplary embodiment of the inventive concept. Referring to FIG. 27, an SSD controller 4210 includes a nonvolatile memory (NVM) interface 4211, a host interface 4212, an error correction code (ECC) circuit 4213, a CPU 4214, and a buffer memory 4215.

The NVM interface 4211 may spread data transferred from the buffer memory 4215 into channels CH1 to CHn. The NVM interface 4211 transmits data read from flash memories 4201 to 420n to the buffer memory 4215. The NVM interface 4211 may use a flash memory interface method, for example. In other words, the SSD controller 4210 may perform a read, a write, and an erase operation according to the flash memory interface method.

The host interface 4212 may provide an interface with the SSD 4200 according to the protocol of the host 4100. The host interface 4212 may communicate with the host 4100 using USB, SCSI, peripheral component interconnect (PCI) express, ATA, Parallel ATA (PATA), Serial ATA (SATA), SAS, or the like. The host interface 4212 may also perform a disk emulation function which enables the host 4100 to recognize the SSD 4200 as a hard disk drive (HDD).

The ECC circuit 4213 may generate an ECC using data transferred to the flash memories 4201 to 420n. The ECC thus generated may be stored at a spare area of the flash memories 4201 to 420n. The ECC circuit 4213 may detect an error of data read from the flash memories 4201 to 420n. If the detected error is correctable, the ECC circuit 4213 may correct the detected error.

The CPU 4214 may analyze and process signals received from the host 4100. The CPU 4214 may control the host 4100 through the host interface 4212 or the flash memories 4201 to 420n through the NVM interface 4211. The CPU 4214 may control the flash memories 4201 to 420n according to firmware for driving the SSD 4200.

The buffer memory 4215 may temporarily store write data provided from the host 4100 or data read from a flash memory. In addition, the buffer memory 4215 may store metadata to be stored in the flash memories 4201 to 420n or cache data. At a sudden power-off operation, metadata or cache data stored at the buffer memory 4215 may be stored in the flash memories 4201 to 420n. The buffer memory 4215 may be implemented with a dynamic RAM (DRAM), a static RAM (SRAM), and so on.

Figure 28:
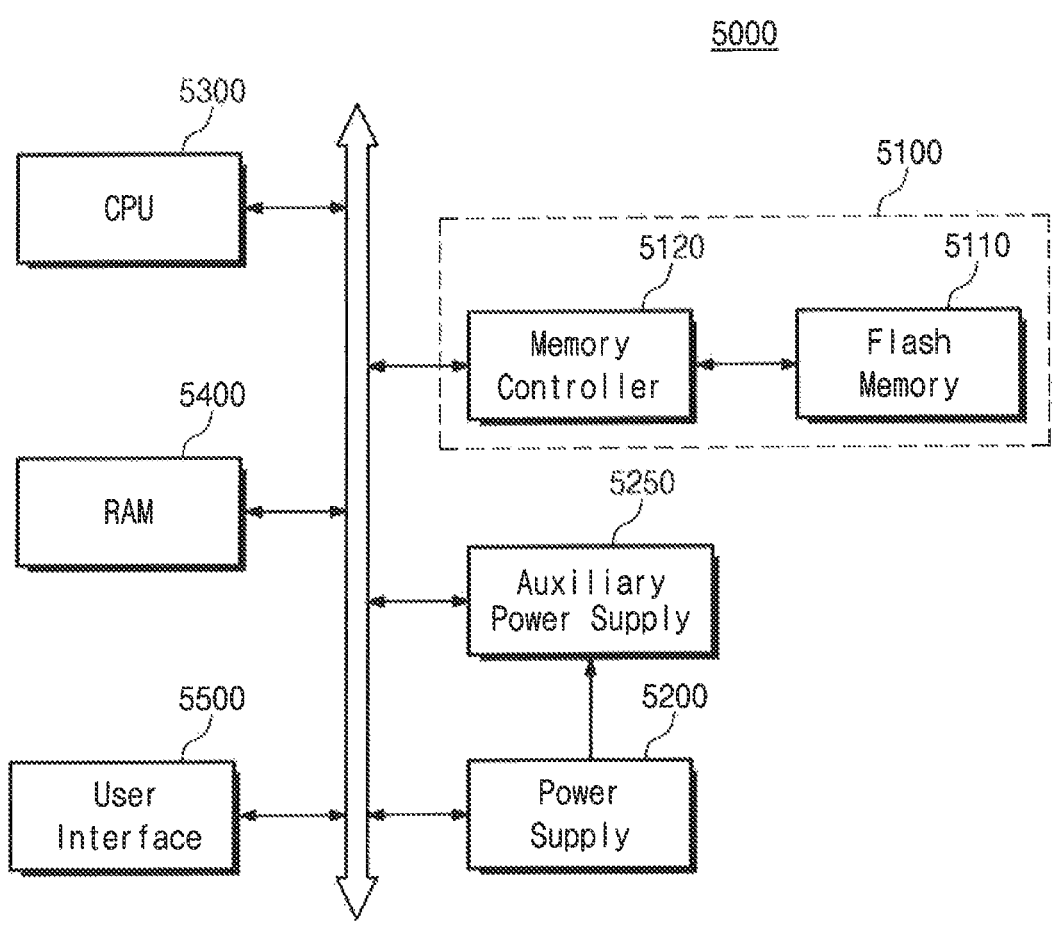
FIG. 28 is a block diagram illustrating an electronic device including a storage device according to an exemplary embodiment of the inventive concept.

FIG. 28 is a block diagram illustrating an electronic device including a storage device according to an exemplary embodiment of the inventive concept. An electronic device 5000 may be implemented with handheld electronic devices, such as a PC or a handheld electronic device, such as a notebook computer, a cellular phone, a PDA, a camera, and so on.

Referring to FIG. 28, the electronic device 5000 includes a memory system 5100, a power supply 5200, an auxiliary power supply 5250, a CPU 5300, a RAM 5400, and a user interface 5500. The memory system 5100 contains a flash memory 5110 and a memory controller 5120.

While the inventive concept has been described with reference to exemplary embodiments thereof, it will be apparent to those skilled in the art that various changes and modifications may be made without departing from the spirit and scope of the present inventive concept as defined by the claims.

What is claimed is:

1. A user device, comprising:
a storage device including a flash memory; and
a host connected to the storage device via an interface and adapted to transmit data to the storage device, wherein the host provides the storage device with erase count information of the flash memory using a host flash translation layer (FTL), provides a setting command mark to setup the storage device for a transfer of the erase count information, provides a setting erase count corresponding to a storage address format, and provides a setting command end mark for ending a command setting.

2. The user device of claim 1, wherein the flash memory includes a plurality of memory blocks, and wherein the erase count information is a max erase count of erase counts of the memory blocks.

3. The user device of claim 1, wherein the host provides the storage device with the erase count information of the flash memory periodically or when the storage device is booted up.

4. The user device of claim 1, wherein the storage device adjusts a read level of the flash memory using the erase count information.

5. The user device of claim 1, wherein the flash memory includes a plurality of block types, and wherein the erase count information is a max erase count of each block type.

6. The user device of claim 1, wherein the host provides the storage device with reprogram information when the flash memory uses a reprogram method and the reprogram information is provided using a program command field format.

7. The user device of claim 6, wherein the program command field format includes a storage address format, and wherein the reprogram information is included in the storage address format.

8. The user device of claim 1, wherein the host provides the storage device with page offset information of an open block of the flash memory when a specific condition is satisfied.

9. The user device of claim 8, wherein the specific condition includes a condition in which a read-target block is an open block and a read operation is first performed after the user device is initialized, a condition in which a read-target block is an open block and a memory block is changed in the same concurrently addressable unit (CAU), or a condition in which a read-target block is an open block and a page offset of the read-target block is changed.

10. The user device of claim 1, wherein a memory cell array of the flash memory has a three-dimensional structure in which cell strings are formed in a direction perpendicular to a substrate.

11. An erase count transferring method of a user device which includes a storage device including a flash memory; and a host connected to the storage device via an interface and adapted to drive a host flash translation layer (FTL), the erase count transferring method comprising:
transferring, from the host, a setting command mark to setup the storage device for a transfer of an erase count;

sending, from the host, a setting erase count corresponding to a storage address format;
transmitting, from the host, erase count data including an erase count of the flash memory; and
sending, from the host, a setting command end mark for ending a command setting.

12. The erase count transferring method of claim 11, wherein the erase count is a max erase count of erase counts of memory blocks in the flash memory.

13. The erase count transferring method of claim 11, wherein the host provides the erase count of the flash memory periodically or when the storage device is booted up.

14. The erase count transferring method of claim 11, wherein the storage device adjusts a read level of the flash memory using the erase count.

15. The erase count transferring method of claim 11, wherein the flash memory includes a plurality of block types, and wherein the erase count is a max erase count of each block type.

16. The user device of claim 1, wherein the setting command mark indicates it is time to set the storage device, the setting erase count comes after the setting command mark, the erase count information includes erase counts of respective block types and comes after the setting erase count, and the setting command end mark represents that the command setting is terminated and comes after the erase count information.

* * * * *